(12) United States Patent
Okumura et al.

(10) Patent No.: US 7,750,654 B2
(45) Date of Patent: Jul. 6, 2010

(54) PROBE METHOD, PROBER, AND ELECTRODE REDUCING/PLASMA-ETCHING PROCESSING MECHANISM

(75) Inventors: Katsuya Okumura, Tokyo (JP); Shigekazu Komatsu, Nirasaki (JP); Yuichi Abe, Fuchu (JP); Kunihiro Furuya, Nirasaki (JP); Vincent Vezin, Nirasaki (JP); Kenichi Kubo, Nirasaki (JP)

(73) Assignees: Octec Inc., Tokyo (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/068,973

(22) Filed: Mar. 2, 2005

(65) Prior Publication Data
US 2005/0151549 A1 Jul. 14, 2005

Related U.S. Application Data

(63) Continuation of application No. PCT/JP03/11165, filed on Sep. 1, 2003.

(30) Foreign Application Priority Data

Sep. 2, 2002 (JP) ............................. 2002-256744
Nov. 20, 2002 (JP) ............................. 2002-336952

(51) Int. Cl.
*G01R 31/02* (2006.01)
(52) U.S. Cl. ..................................... 324/760
(58) Field of Classification Search .................. None
See application file for complete search history.

(56) References Cited

U.S. PATENT DOCUMENTS 3,411,199 A * 11/1968 Heiman et al. .............. 438/286
6,043,451 A * 3/2000 Julien et al. ............. 219/121.47
6,057,694 A * 5/2000 Matsudo ..................... 324/757
6,191,416 B1 2/2001 Tscherisich et al.
6,283,087 B1 * 9/2001 Isaksen ....................... 123/243
6,288,561 B1 * 9/2001 Leedy ........................ 324/760
6,589,349 B2 * 7/2003 Kashiwagi et al. .......... 118/708
6,667,244 B1 * 12/2003 Cox et al. .................... 438/712
6,793,833 B2 * 9/2004 Mizumura et al. ............. 216/60

(Continued)

FOREIGN PATENT DOCUMENTS

CN 1060079 A 4/1992

(Continued)

OTHER PUBLICATIONS

M. R. Baklanov, et al. "Characterization of Cu Surface by Hydrogen Plasma" Jul./Aug. 2001 J. Vac. Technol. B 19(4) pp. 1201-1211.

*Primary Examiner*—Roberto Velez
(74) *Attorney, Agent, or Firm*—Oblon, Spivak, McClelland, Maier & Neustadt, L.L.P.

(57) ABSTRACT

A probe method of this invention includes a step of reducing an electrode of a wafer by using a forming gas, and a step of bringing the electrode and a probe pin into contact with each other in a dry atmosphere. The probe method further includes, prior to a reducing process of an electrode of the object to be tested, placing the object to be tested in an inert gas atmosphere and heating the object to be tested. The reducing process is performed by bringing a reducing gas into contact with the electrode of the object to be tested under atmospheric pressure.

27 Claims, 14 Drawing Sheets

U.S. PATENT DOCUMENTS

| | | | |
|---|---|---|---|
| 6,803,588 B2 * | 10/2004 | Kamieniecki | 250/492.2 |
| 7,235,137 B2 * | 6/2007 | Kitayama et al. | 118/724 |
| 2001/0038988 A1 * | 11/2001 | Oda et al. | 432/5 |

FOREIGN PATENT DOCUMENTS

| | | |
|---|---|---|
| JP | 3-184355 | 8/1991 |
| JP | 5-102665 | 4/1993 |
| JP | 5-198509 | 8/1993 |
| JP | 6-104321 | 4/1994 |
| JP | 6-151529 A | 5/1994 |
| JP | 9-298225 | 11/1997 |
| JP | 11-67702 | 3/1999 |
| JP | 11-163066 | 6/1999 |
| JP | 2000-252313 | 9/2000 |
| JP | 2000-311868 | 11/2000 |
| JP | 2002-139542 A | 5/2002 |
| WO | WO 02059953 A1 * | 8/2002 |

* cited by examiner

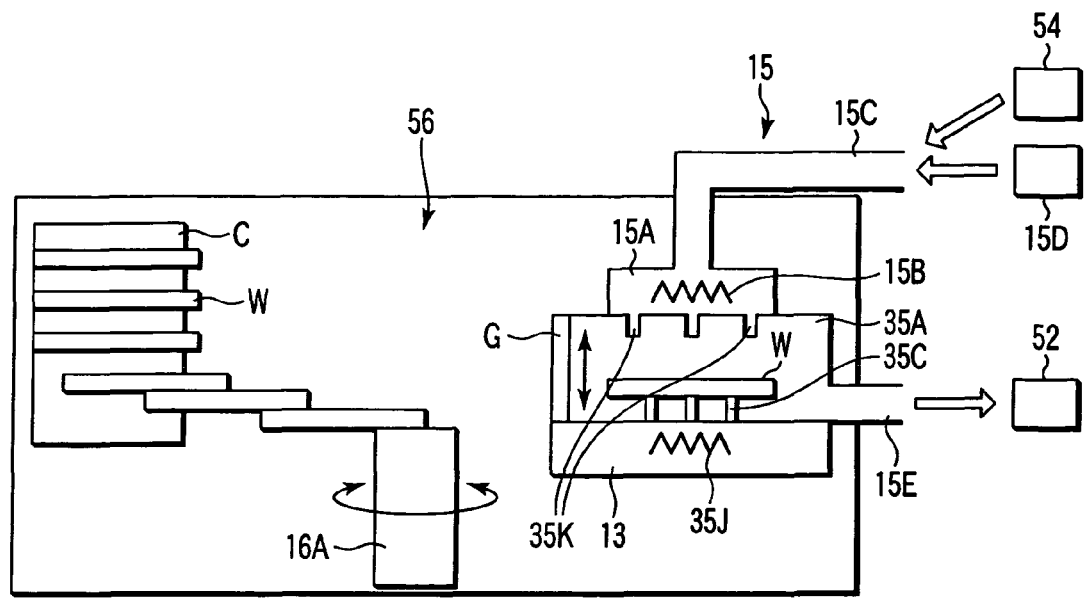
F I G. 3A
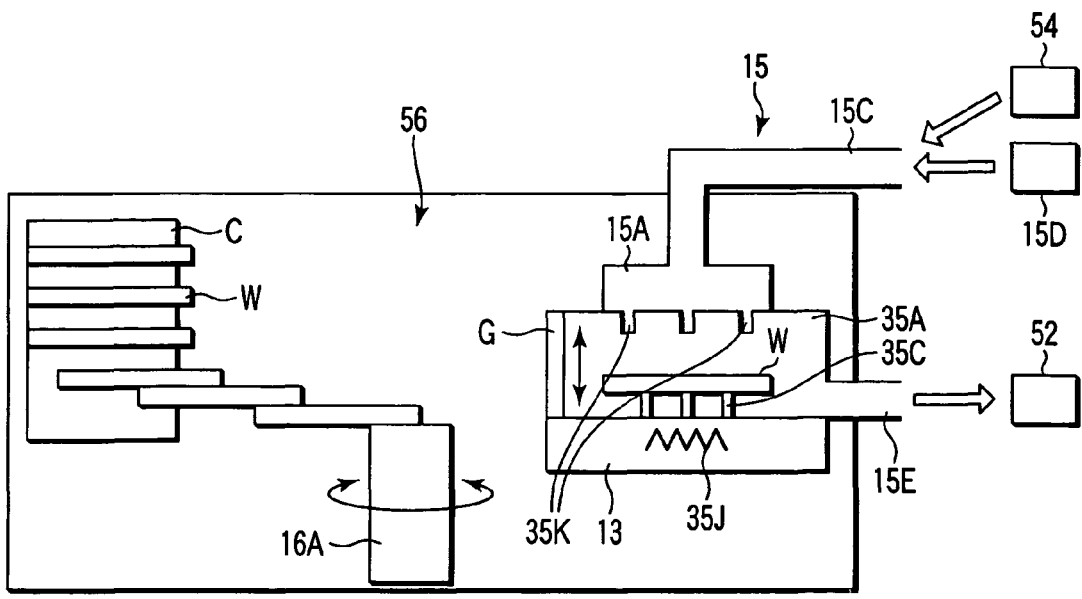
F I G. 3B

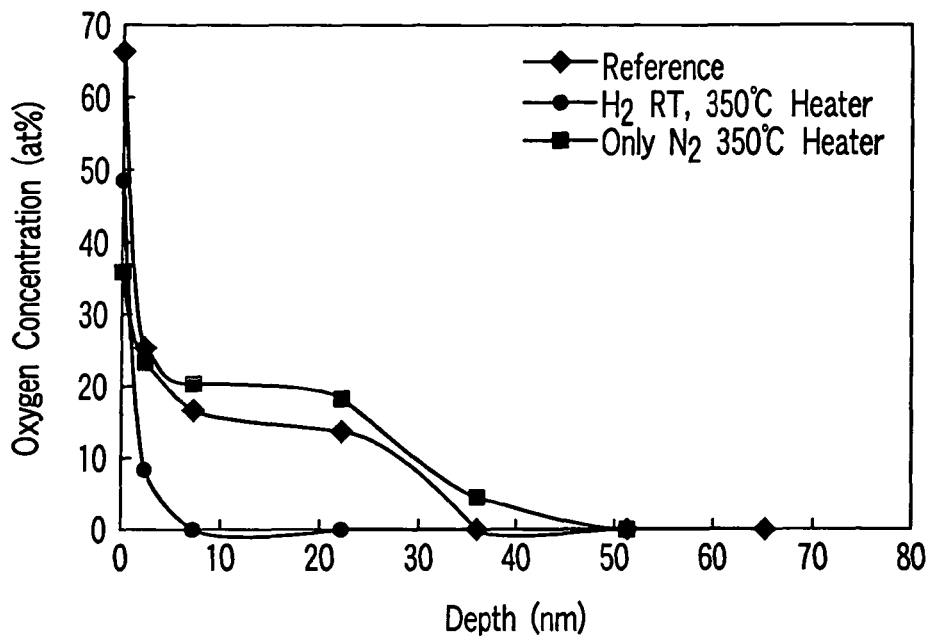
F I G. 5
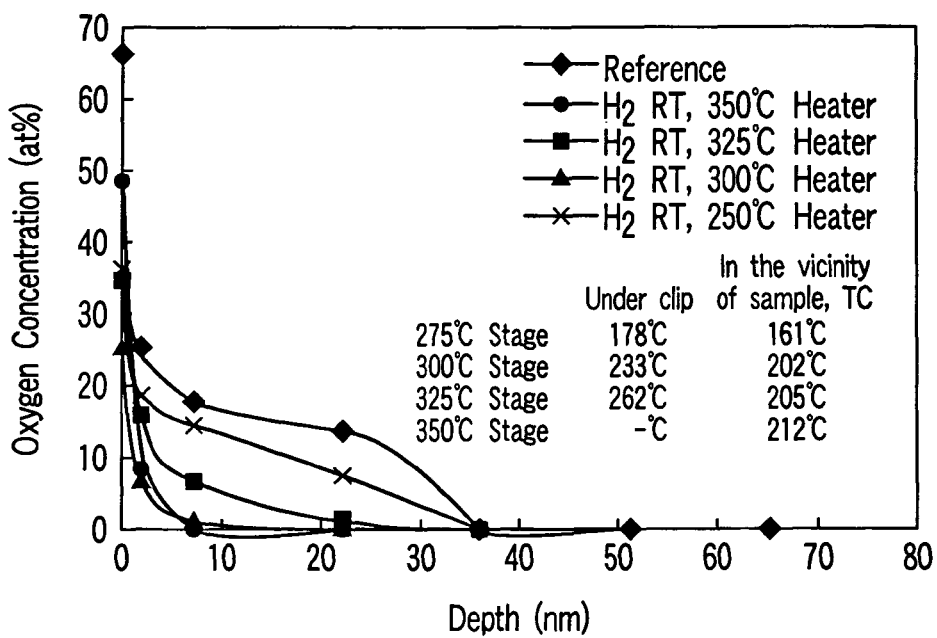
F I G. 6

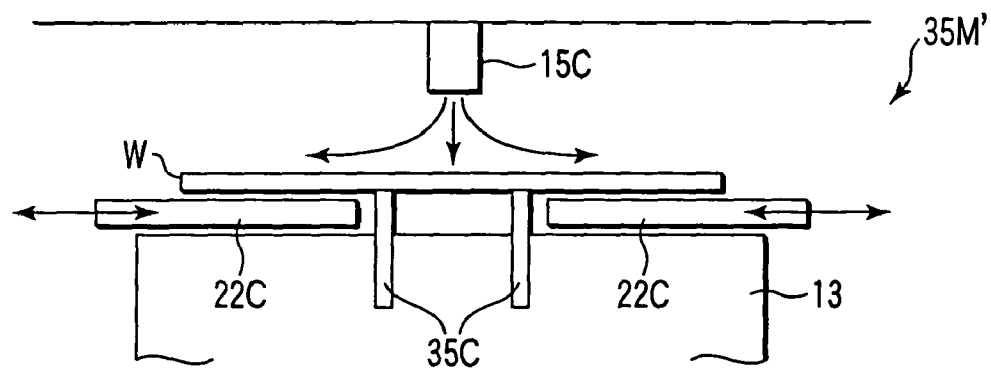
F I G. 12A
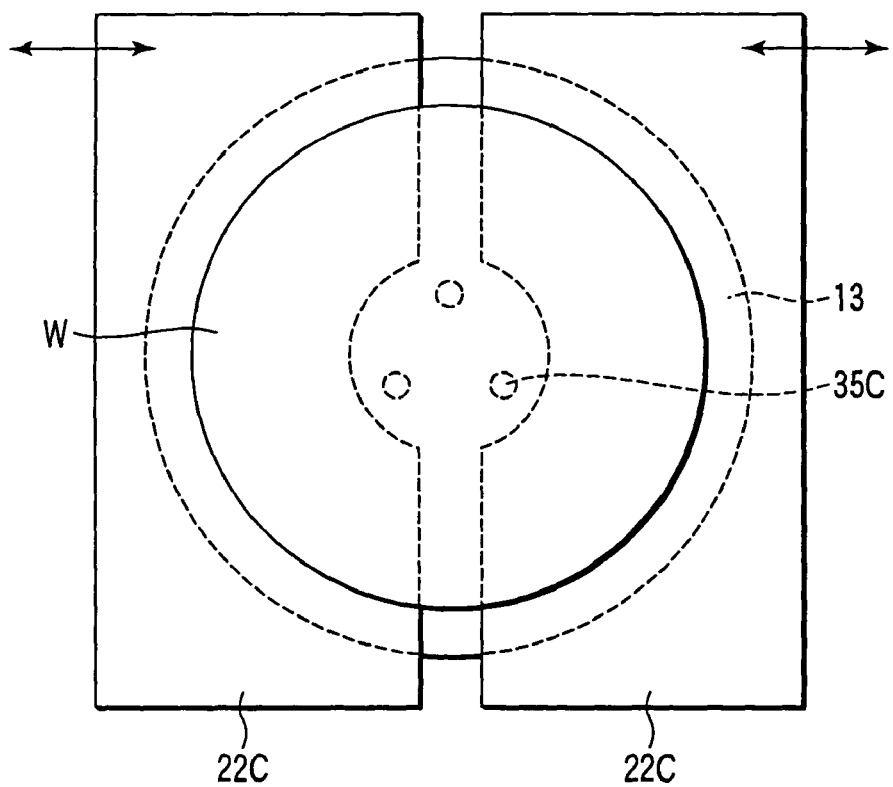
F I G. 12B

PROBE METHOD, PROBER, AND ELECTRODE REDUCING/PLASMA-ETCHING PROCESSING MECHANISM

CROSS REFERENCE TO RELATED APPLICATIONS

This is a Continuation Application of PCT Application No. PCT/JP03/11165, filed Sep. 1, 2003, which was published under PCT Article 21(2) in Japanese.

This application is based upon and claims the benefit of priority from prior Japanese Patent Applications No. 2002-256744, filed Sep. 2, 2002; and No. 2002-336952, filed Nov. 20, 2002, the entire contents of both of which are incorporated herein by reference.

BACKGROUND OF THE INVENTION

1. Field of the Invention

The present invention relates to a probe method, a prober, and an electrode reducing/plasma-etching process mechanism. More specifically, the present invention relates to a probe method, a prober, and an electrode reducing/plasma-etching process mechanism which can improve the electrical contact state of the electrode of an object to be tested and a probe pin.

2. Description of the Related Art

A process of manufacturing an electrical product and electrical component (e.g., a semiconductor) includes various steps such as a film formation step of forming various types of metal layers such as an interconnection layer on a target object (e.g., a wafer), a step of testing the object to be tested which is formed on the wafer, and a step of testing the packaged object to be tested. For example, to test the electrical characteristics of the object to be tested which is formed on the wafer, a probe pin is brought into contact with an electrode of the object to be tested. A measurement signal is applied to the object to be tested from a tester through the probe pin. If an electrically insulating oxide film has been formed on the surface of the electrode of the object to be tested, sometimes the electrode cannot be electrically connected to the probe pin by merely bringing the probe pin into contact with the electrode. In this case, a test signal cannot be applied to the electrode from the tester. Conventionally, while the probe pin is in contact with the electrode with a predetermined needle pressure, the probe pin scrubs the electrode surface to break the oxide film on the electrode surface, so that the probe pin and electrode are brought into electrical contact with each other.

As the integration degree of semiconductor products becomes ultra-high, the thicknesses of the deposition layers of the semiconductor products decrease acceleratingly. Electrodes also become thin. If the probe pin is brought into contact with the electrode with a needle pressure of a degree that barely breaks the oxide film, as in the conventional probe method, the needle pressure of the probe pin may undesirably change the electrical characteristics of the semiconductor product. When the lower layer of the electrode is made of a soft material such as a low-k material that has a low dielectric constant, the probe pin cannot be brought into contact with the electrode with such needle pressure.

In the film formation step, an oxide film on a metal layer hinders formation of another metal layer on it. Therefore, the oxide film must be reduced and removed in advance by cleaning or the like. For example, Jpn. Pat. Appln. KOKAI Publication No. 2000-311868 (claim 14 and paragraph [0041]) describes, in a process of forming a via hole for connecting different interconnection layers in a multilayered interconnection, a process of cleaning the via hole before forming an upper metal interconnection. In this process, a native oxide film and the like formed in the via hole in the surface of a silicon substrate are removed by using negative hydrogen ions generated by supplying electrons to hydrogen radicals. In this process, a gas containing hydrogen atoms is subjected to microwave discharge irradiation in a vacuum container, thus generating a hydrogen plasma. An electron supply device supplies thermoelectrons to the hydrogen radicals to generate negative hydrogen ions. In this reference, the negative hydrogen ions are used for cleaning.

In the testing step, a probe pin is brought into electrical contact with an electrode on the wafer surface. While the probe pin and electrode are in electrical contact with each other, testing of the object to be tested is performed. If an oxide film is present on the electrode surface, as the oxide film is an insulator, it interferes with electrical contact of the probe pin and electrode. For this reason, the oxide film on the electrode surface must be removed prior to testing. To remove the oxide film, a reducing method described in Jpn. Pat. Appln. KOKAI Publication No. 2000-311868 can be used. With this reducing method, however, the wafer is exposed to harsh conditions. Accordingly, elements formed on the wafer may be damaged, decreasing the yield.

U.S. Pat. No. 6,191,416 B1 (claims and the fourth column, 4 to 16 lines) describes an apparatus which generates free atoms or radical particles. This apparatus has a tube for supplying a gas, e.g., hydrogen gas or halogen gas, and a wire extending along the tube and connected to a power supply. A current is supplied to the wire to heat it. The radiation heat of the wire heats the gas flowing in the tube to 1,500° K to 2,500° K, to thermally decompose the gas, thus forming an atomic material or radicals. The atomic material or radicals of the gas serve to reduce other materials. This apparatus is compact and inexpensive when compared to that of Jpn. Pat. Appln. KOKAI Publication No. 2000-311868. However, the tube must be heated to a high temperature.

"Characterization of Cu surface cleaning by hydrogen plasma", M. R. Baklanov, D. G. Shamiryan, Zs. Tokei, G. P. Beyer, T. Conard, S. Vanhaelemeersch, and K. Maexj. Vac. Sci. Technol. B19(4), July/August 2001 (preface of page 1,201) reports a technique of thermally decomposing such copper oxide, copper hydroxide, and the like into water or the like and copper oxide in a vacuum at a temperature of 150° C. or more to remove water or the like from the metal surface, and reducing and removing the remaining copper oxide with a hydrogen plasma.

According to the technique described in U.S. Pat. No. 6,191,416 B1, hydrogen radicals and atomic hydrogen can be generated from the hydrogen gas with a comparatively simple apparatus. However, the reducing ability of the hydrogen radicals and atomic hydrogen is not clear.

According to "Characterization of Cu surface cleaning by hydrogen plasma", copper oxide, hydroxide, and the like on the copper metal surface are reduced in a vacuum by using the hydrogen plasma at the temperature of 150° C. or more. Therefore, reduction must be performed in a vacuum atmosphere in the same manner as in Jpn. Pat. Appln. KOKAI Publication No. 2000-311868.

BRIEF SUMMARY OF THE INVENTION

The present invention is based on the above problems and solves at least one of them. According to one aspect of the present invention, there can be provided a probe method, a prober, and an electrode reducing/plasma-etching process mechanism which can bring probe pins into electrical contact with electrodes with as low a needle pressure as possible.

According to another aspect of the present invention, an oxide and the like on the metal layer surface or electrode layer surface of a target object can be reduced under an atmospheric pressure at a comparatively low heating temperature.

According to another aspect of the present invention, there can be provided a target object reducing method with which damage to the target object can be decreased.

According to a first aspect of the present invention, there is provided a probe method of bringing a probe pin into electrical contact with, of an object to be tested having electrodes, at least one electrode to test electrical characteristics of the object to be tested. The probe method comprises: (a) performing at least one of a reducing process and plasma-etching process for the electrode of the object to be tested; (b) bringing the testing electrode and the probe pin into contact with each other in a non-oxidizing atmosphere; and (c) testing the electrical characteristics of the object to be tested.

This probe method preferably comprises any one of the following arrangements a) to j), or some arbitrary ones of the arrangements in combination.

a) The reducing process is performed by bringing one of a gas containing hydrogen gas and a gas obtained by activating a hydrogen-containing gas with a catalyst metal into contact with a surface of the electrode of the object to be tested, the plasma-etching process is performed by a gas containing plasmatized hydrogen gas, and the non-oxidizing atmosphere comprises a dry atmosphere.

b) The catalyst metal is at least one of a platinum group metal and an alloy of a platinum group metal.

c) The reducing/plasma-etching process comprises heating the object to be tested.

d) The method comprises, prior to the reducing process of the electrode of the object to be tested, placing the object to be tested in an inert gas atmosphere and heating the object to be tested, wherein the reducing process is performed by bringing a reducing gas into contact with the electrode of the object to be tested under atmospheric pressure.

e) The reducing gas in the reducing process is one of a normal-temperature reducing gas containing hydrogen gas and a normal-temperature forming gas.

f) A temperature at which the object to be tested is heated prior to a process of reducing the electrode of the object to be tested falls within a range of 150 to 270° C.

g) The catalyst includes palladium.

h) The reducing gas is a forming gas.

i) The electrode contains at least one of copper and a copper alloy.

j) The inert gas is nitrogen gas.

According to a second aspect of the present invention, there is provided a prober for bringing a probe pin into electrical contact with, of an object to be tested having electrodes, at least one electrode to test electrical characteristics of the object to be tested. The prober comprises:

a reducing/plasma-etching process mechanism which performs at least one of a reducing process using a reducing gas and an etching process using a plasma gas for the electrode of the object to be tested; and a mechanism which moves at least one of the object to be tested and probe pin, to bring the electrode of the object to be tested and the probe pin into electrical contact with each other.

The prober preferably comprises any one of the following arrangements k) to x) or some arbitrary ones of the arrangements in combination.

k) The reducing gas is one of a gas containing hydrogen gas and a forming gas.

l) Comprising a mechanism which places the object to be tested in an inert gas atmosphere and heats the object to be tested, wherein the reducing process with the reducing/plasma-etching process mechanism is performed by bringing the reducing gas into contact with the electrode of the object to be tested under atmospheric pressure.

m) The reducing gas in the reducing process with the reducing/plasma-etching process mechanism is one of normal-temperature hydrogen gas and a normal-temperature forming gas.

n) The heating mechanism heats the object to be tested in a range of 150 to 270° C.

o) A mechanism which sets a non-oxidizing atmosphere at least around the electrode of the object to be tested which has been processed by the reducing/plasma-etching process mechanism.

p) The mechanism which sets the non-oxidizing atmosphere sets a dry atmosphere at least around the electrode.

q) The prober comprises a prober chamber where the electrical characteristics of the object to be tested are tested, and the reducing/plasma-etching process mechanism is arranged in the prober chamber.

r) The prober comprises a loader chamber where the object to be tested is loaded and unloaded, and the reducing/plasma-etching process mechanism is provided in the loader chamber.

s) The reducing/plasma-etching process mechanism has at least one of a processing vessel, a stage which is arranged in the processing vessel and on which the object to be tested is to be placed, a temperature adjusting mechanism of the stage, a mechanism which supplies a reducing gas to a surface of the object to be tested which is heated by the temperature adjusting mechanism, and a mechanism which supplies an etching gas.

t) Means for supplying the reducing gas to the surface of the object to be tested includes a supply source of a gas containing hydrogen gas, a gas channel where the gas is supplied from the supply source of the gas, and means for activating the gas in the gas channel.

u) Means for activating the gas in the gas channel comprises a catalyst metal which is arranged on an inner surface of the gas channel.

v) The catalyst metal is at least one of a platinum group metal and an alloy of the platinum group metal.

w) The catalyst is palladium.

x) The reducing/plasma-etching process mechanism has a processing vessel, a stage which is arranged in the processing vessel and places the object to be tested thereon, a mechanism which supplies the reducing gas into the processing vessel, and a mechanism which generates a plasma from the reducing gas in the processing vessel.

According to a third aspect of the present invention, there is provided, in a prober for testing electrical characteristics of an object to be tested, a reducing/plasma-etching process mechanism to perform at least one of a reducing process and plasma-etching process for an electrode of the object to be tested. The reducing/plasma-etching process mechanism includes:

a gas source which supplies a gas containing hydrogen gas;

a gas channel where a hydrogen-containing gas is supplied from the gas source; and a process mechanism which is arranged in the gas channel and performs at least one of an activation process and plasmatization process using the hydrogen-containing gas.

In the reducing/plasma-etching process mechanism, preferably, the gas channel includes an inner wall surface, and a surface of the inner wall surface includes a catalyst metal.

BRIEF DESCRIPTION OF THE SEVERAL VIEWS OF THE DRAWING

FIGS. 1A and 1B are sectional views showing a prober according to one embodiment of the present invention, in which FIG. 1A shows a prober having a heater 15B in a gas supply container 15A, and FIG. 1B shows a prober having no such heater;

FIGS. 3A and 3B are sectional views showing reducing/plasma-etching process devices applied to a prober according to still another embodiment of the present invention, in which FIG. 3A is a sectional view showing a reducing/plasma-etching process device having a heater 15B, and FIG. 3B is a sectional view showing a reducing/plasma-etching process device having no such heater;

FIG. 5 is a graph showing, together with a comparative example, the distribution of oxygen concentration in a thin copper film which is obtained when a reducing process for a copper wafer is performed by using a probe method according to one embodiment of the present invention;

FIG. 6 is a graph showing the temperature of the copper wafer and the distribution of oxygen concentration in the thin copper film which are obtained when a reducing process for the copper wafer is performed by using the probe method according to one embodiment of the present invention;

FIGS. 7A and 7B are graphs showing the influence of humidity on oxidation of the reduced copper wafer, in which FIG. 7A is a graph showing the temperature of the copper wafer and the distribution of oxygen concentration in the thin copper film which are obtained when the copper wafer is left in dry air and in an atmosphere for a predetermined period of time, and FIG. 7B is a graph showing oxidation rates in dry air and in the atmosphere;

FIGS. 12A and 12B are views showing another example of a reducing process apparatus that can be incorporated in a testing device or the like of FIG. 1, in which FIG. 12A is a sectional view of the same, and FIG. 12B is a plan view of the same;

DETAILED DESCRIPTION OF THE INVENTION

Figure 1A:
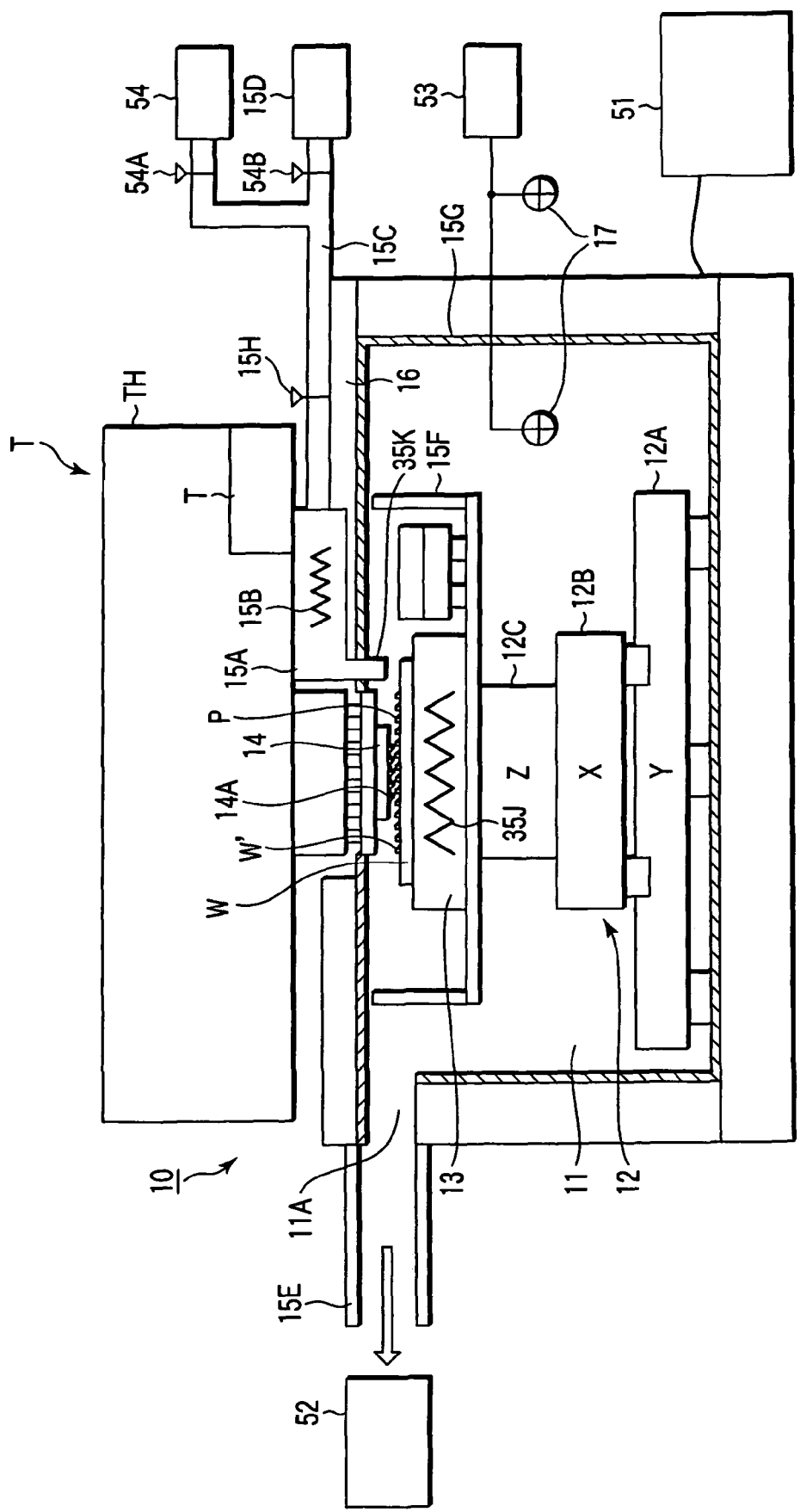

The embodiment of the present invention will be described with reference to FIGS. 1A to 10B. According to the embodiment of the present invention, oxide films formed on the electrode surfaces of a wafer are reduced or plasma-etched by using, e.g., hydrogen gas or a reducing gas (forming gas as a gas mixture of hydrogen gas and nitrogen gas) containing hydrogen gas, to remove the oxide films partly or entirely (this will be described as "to remove the oxide films" hereinafter).

When the oxide films on the electrodes are removed, probe pins 14A can be brought into electrical contact with the electrodes with a low needle pressure. Consequently, the electrodes will not be damaged by the probe pins 14A, and the service life of the probe pins 14A can be prolonged.

A prober according to this embodiment will be described. As shown in, e.g., FIG. 1A, a prober 10 of this embodiment can have a loader chamber (56 in FIG. 4) which transports a target object W (e.g., a wafer), a prober chamber 11 where the electrical characteristics of objects W' to be tested (to be referred to as integrated circuits hereinafter) formed on the wafer W are tested, and a controller 51 which controls various types of devices arranged in the two chambers.

The loader chamber 56 can include a stage portion where a cassette which stores, e.g., 25 wafers W, is to be placed, a wafer transporting mechanism 16A which transports the wafers W one by one from the cassette C, and a subchuck which aligns the wafers in a predetermined direction while the wafers W are being transported with the wafer transporting mechanism 16A.

The prober chamber 11 can include a stage 13, a probe card 14 arranged above the stage 13, an alignment mechanism (not shown) which aligns probe pins 14A of the probe card 14 and electrodes P of the objects W' to be tested on the wafer W, and a process means (to be referred to as a "reducing/plasma-etching process mechanism" hereinafter) 15 which performs at least one of a reducing process and plasma-etching process for the electrodes P of the objects W' to be tested on the wafer W.

The stage 13 can be moved in three-axis directions by a three-axis (X-axis, Y-axis, and Z-axis) moving mechanism 12 and can be rotated clockwise and counterclockwise in a θ direction by a rotary mechanism. The stage 13 can also include a temperature adjusting mechanism 35J which adjusts the temperature of the objects W' to be tested which are placed on the stage 13.

The probe pins 14A of the probe card 14 come into contact with the electrodes P of the integrated circuits formed on the wafer W, to connect the tester T and electrodes P to each other. The electrodes P can be made of a conductive metal, e.g., copper, a copper alloy, or aluminum.

The reducing/plasma-etching process mechanism 15 removes the oxide films formed on the electrode surfaces of the objects (W') to be tested on the stage 13.

The probe card 14 can be fixed to a head plate 16 on the upper portion of the prober chamber 11. A test head TH having a tester T is arranged on the head plate 16 such that the test head TH can be electrically connected to the probe card 14. As shown in FIG. 1A, the moving mechanism 12 can have a Y table 12A which moves in a Y direction (a direction perpendicular to the sheet surface in FIG. 1A) on the floor surface in the prober chamber 11, an X table 12B which moves in an X direction on the Y table 12A, and a Z-axis mechanism 12C which is arranged on the X table 12B. The moving mechanism 12 can be a mechanism that may use the principle of a linear motor. The moving mechanism 12 moves the stage 13 in the X, Y, and Z directions. The stage 13 can incorporate a temperature adjusting mechanism 35J which adjusts the temperature of the objects (W') to be tested which are placed on the stage 13 in the range of, e.g., −55 to 400° C. The stage 13 can be rotated clockwise and counterclockwise by a θ-driving mechanism (not shown).

The reducing/plasma-etching process mechanism (to be referred to as a reducing process mechanism hereinafter) 15 performs at least one of a reducing process and plasma-etching process for the oxide films on the electrode surfaces of the objects (W') to be tested which are placed and heated on the stage 13 under atmospheric pressure or reduced pressure. As shown in, e.g., FIG. 1A, the reducing process means 15 can have a gas supply container 15A arranged on the head plate 16 and made of a heat-resistant material such as, e.g., quartz or a ceramic material, a heater 15B arranged in the gas supply container 15A, a gas supply pipe 15C connected to the inlet of the gas supply container 15A, a gas supply source 15D which is connected to the gas supply pipe 15C and supplies a forming gas, and a mass flow controller 15H which controls the flow rate of the forming gas from the gas supply source 15D. The reducing process means 15 can heat the forming gas with the heater 15B in the gas supply container 15A. The heated forming gas reduces or plasma-etches the oxide films on the electrodes P of the objects W' to be tested which are heated on the stage 13.

The gas supply container 15A can include a heat-insulating mechanism. The heat-insulating mechanism prevents temperature decrease in the gas supply container 15A. As shown in FIG. 1A, a gas discharge port 35K of the gas supply container 15A can be arranged such that it extends through the head plate 16 at a position adjacent to the probe card 14 and opposes the upper surface of the stage 13. The prober chamber 11 has an exhaust port 11A. The exhaust port 11A can be connected to an exhaust device 52 through an exhaust pipe 15E. A flat vessel 15F which has an open upper end and surrounds the stage 13 can be fixed to the upper portion of the moving mechanism 12. The vessel 15F can be formed to have a diameter larger than that of the stage 13. The vessel 15F can be filled with the forming gas supplied from the gas supply container 15A. A reducing atmosphere can be set in the interior of the vessel 15F with the forming gas. The gas discharge port 35K of the gas supply container 15A can be set at any position as far as it falls within the moving range of the stage 13.

The forming gas can be a gas mixture consisting of hydrogen gas and carrier gas (nitrogen gas). The forming gas in the prober chamber 11 can be adjusted by the mass flow controller 15H such that the content of the hydrogen gas falls within an non-explosive range (e.g., 5% by volume or less and more particularly approximately 3%). As the carrier gas, other than nitrogen gas, for example, a noble gas such as argon or helium can be used.

The inner surface of the prober chamber 11 can have a shield member 15G. The shield member 15G can hold the interior of the prober chamber 11 in an air-tight state to maintain the interior of the prober chamber in a predetermined reduced-pressure state. Oxygen concentration meters 17 can be arranged inside and outside the prober chamber 11. The oxygen concentration meters 17 measure the oxygen concentrations inside and outside the prober chamber 11. When an oxygen concentration meter 17 detects an oxygen concentration of a critical level, a warning unit 53 such as an alarm can produce a warning.

The prober 10 can include a means 54 for supplying dry air. The dry air supply source 54 supplies dry air onto the stage in the prober chamber 11, so that the electrical characteristics of the objects W' to be tested can be tested in the dry atmosphere. With the dry atmosphere, those electrode surfaces of the objects W' to be tested from which the oxide films have been removed by the process mechanism 15 are prevented from being oxidized again by water in the air. When supplying dry air into the prober chamber 11, the gas supply pipe 15C of the reducing process mechanism 15 can be utilized.

An embodiment of a probe method which uses the prober 10 will be described. In the prober chamber 11, the probe pins 14A and the electrodes P of the objects W' to be tested are aligned. Air in the prober chamber 11 is exhausted through the exhaust pipe 15E, and the forming gas from the gas supply source 15D is supplied into the gas supply container 15A. The heater 15B in the gas supply container 15A heats the forming gas. The heated forming gas is supplied toward the objects (W') to be tested on the stage 13 through the gas discharge port 35K of the gas supply container 15A.

The interior of the vessel 15F is filled with the forming gas, so that a reducing atmosphere is formed in the vessel 15F. The forming gas reduces the oxide films of the electrodes P of the objects W' to be tested which are already heated to a temperature of, e.g., 200° C. or more by the temperature adjusting mechanism (35J) of the stage 13, to remove the oxide films on the electrode surfaces partly or entirely. The forming gas after the reducing process flows from the vessel 15F into the prober chamber 11, and is exhausted from the prober chamber 11 to the outside through the exhaust pipe 15E. During this operation, if air is not sufficiently exhausted from the prober chamber 11 and the oxygen concentration is higher than a predetermined preset value, the warning unit 53 produces a warning.

After the reducing process means 15 removes the oxide films on the electrodes P, dry air (with a dew point of, e.g., −70° C.) is supplied into the vessel 15F, to set a dry atmosphere in the vessel 15F. In this state, the moving mechanism 12 drives to bring the probe pins 14A of the probe card 14 and the electrodes P of the objects W' to be tested into contact with each other. At this time, as the oxide films of the electrodes P are removed, the probe pins 14A and the electrodes P need only be brought into contact with each other with a needle pressure lower than in the conventional case, so that they are brought into electrical contact with each other. Thus, the tester T can test the electrical characteristics of the objects W' to be tested.

As described above, this embodiment includes reducing the oxide films on the electrodes P under the atmospheric pressure or reduced pressure by using the reducing gas (e.g., forming gas), and bringing the electrodes P and the probe pins 14A into electrical contact with each other in the dry atmosphere. Thus, the probe pins 14A and electrodes P need only be brought into contact with each other with a very low needle pressure (e.g., 0.2 mN or less), so that they are brought into electrical contact with each other. Thin deposition layers such as the electrodes P or their underlying layers can be avoided from being damaged by the low needle pressure of the probe pins 14A. According to this embodiment, the hydrogen gas in the forming gas is activated by the heater 15B. The reducing process or plasma-etching process using activated hydrogen can remove the oxide films on the electrodes P within a short time. In addition, since the forming gas and objects (W') to be tested are heated, the reducing reaction/plasma-etching process can be promoted.

Figure 1B:
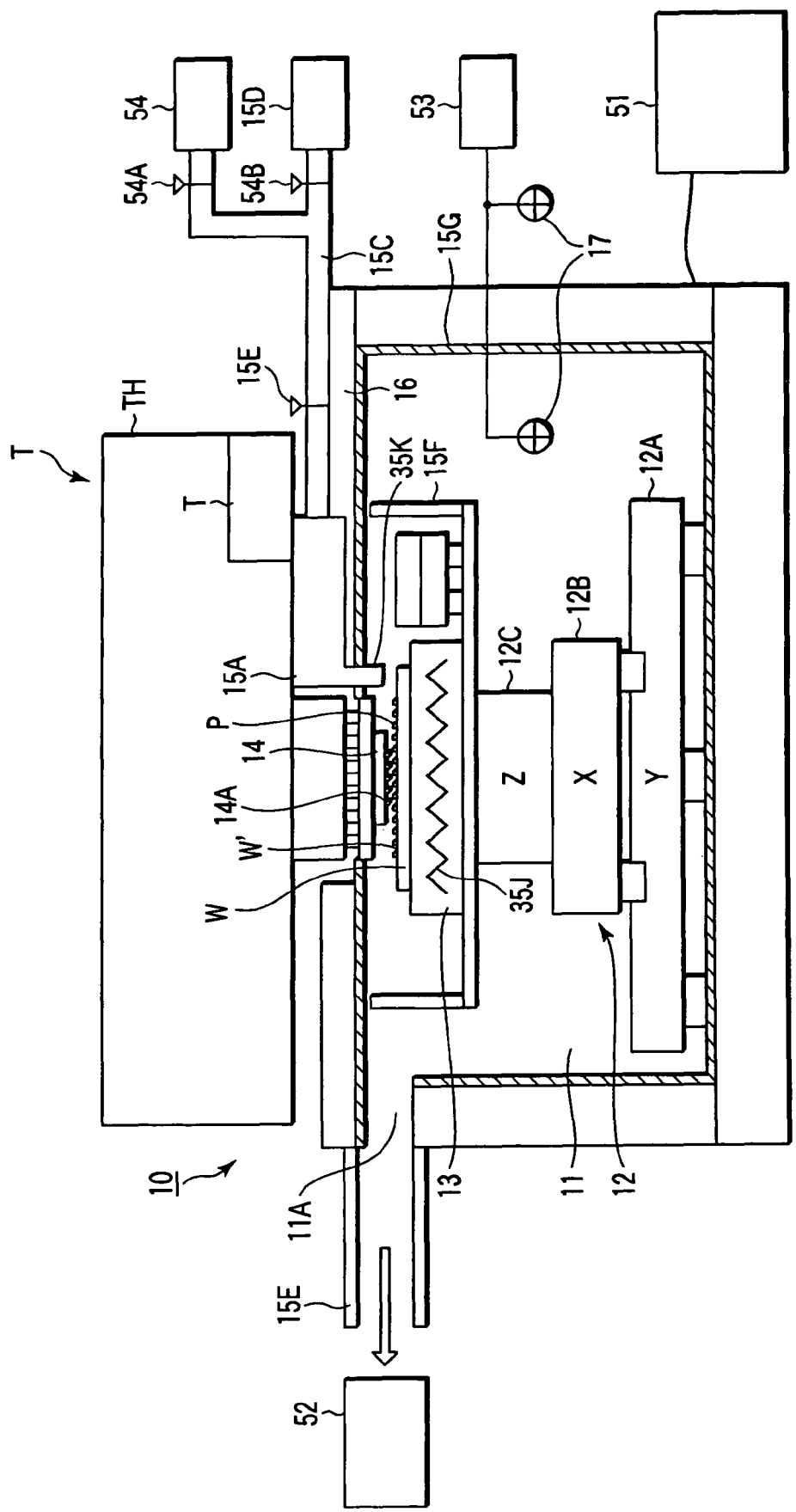

In this embodiment, the reducing process means 15 having the heater 15B is used. Alternatively, as shown in FIG. 1B, the heater 15B may be omitted, and only the gas supply source 15D may be provided. In this case, a reducing gas (forming gas) is supplied into the prober chamber 11 from the gas supply source 15D, to reduce the objects W' to be tested which are heated to a predetermined temperature (e.g., 200° C. or more) on the stage 13.

Figure 2A:
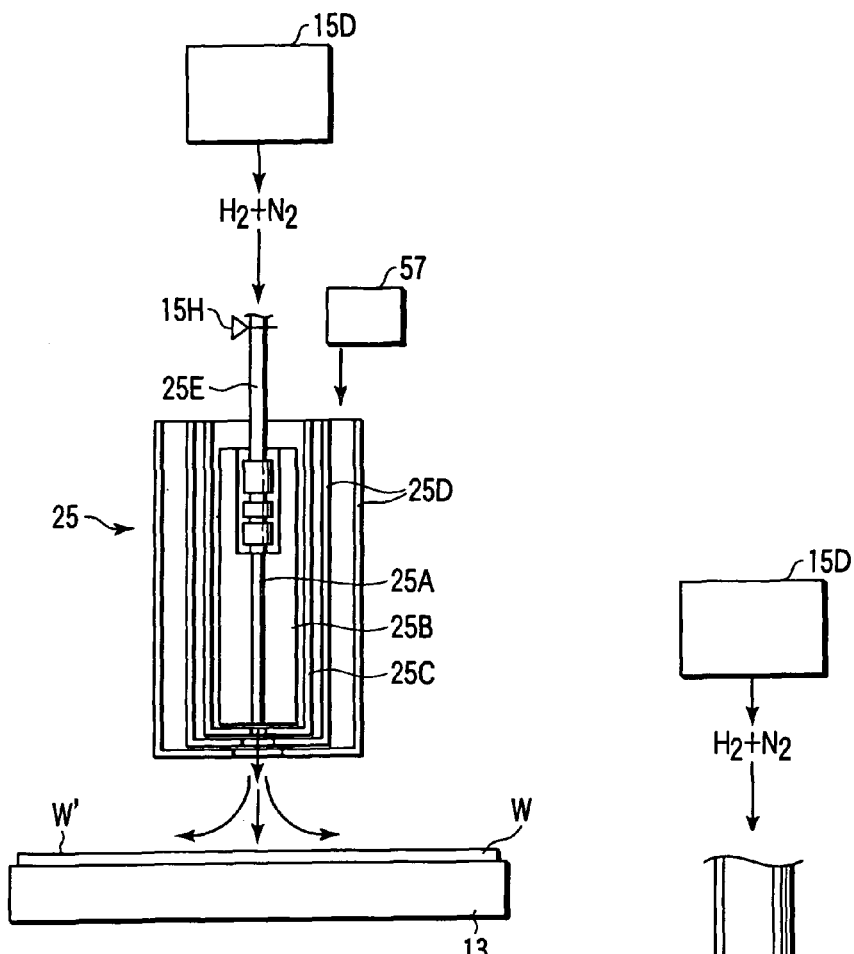
FIGS. 2A and 2B are sectional views showing a reducing process device that can be applied to a prober according to another embodiment of the present invention.

FIG. 2A shows another embodiment of the reducing process mechanism. A prober according to this embodiment is different from that of the above embodiment only in the reducing process mechanism. As shown in FIG. 2A, a reducing process mechanism 25 used in this embodiment has a palladium pipe (with a diameter of, e.g., 3 to 100 mm) 25A which is formed of a platinum group element (e.g., palladium) or its alloy into a pipe. The palladium pipe 25A is a gas channel. The reducing process mechanism 25 can have a pipe-like heater 25B surrounding the palladium pipe 25A, a heat-insulation pipe 25C for accommodating the heater 25B, and a storing pipe 25D which has a double-wall structure and accommodates the heat-insulation pipe 25C. The reducing process mechanism 25 can be attached to a head plate 16.

A gas supply source 15D is connected to the upper end of the palladium pipe 25A through a gas supply pipe 25E. The gas supply source 15D supplies a gas (e.g., a forming gas) containing hydrogen gas to the palladium pipe 25A while controlling the flow rate of the gas with a mass flow controller 15H. Each of the heat-insulation pipe 25C and storing pipe 25D has a bottom surface with an outlet formed at its center. The bottom surface of the storing pipe 25D also has a double structure, and an inert gas such as nitrogen gas is supplied to a space between the two walls. The inert gas supplied from the outlet of the storing pipe 25D into a prober chamber purges air in the prober chamber. The palladium pipe 25A has a function of activating the hydrogen gas. The palladium pipe 25A may be of a mesh type or sponge type. In place of the palladium pipe 25A, a granular palladium catalyst or palladium coil may be arranged in a pipe made of a corrosion-resistant material.

The operation of the reducing process mechanism 25 will be described. First, nitrogen gas is supplied from the storing pipe 25D into the prober chamber. The nitrogen gas purges air in the prober chamber. The heater 25B heats the palladium pipe 25A to the activation temperature (600° C. or less) of hydrogen gas or a temperature for plasmatizing hydrogen. Subsequently, a forming gas is supplied from the gas supply source 15D to the palladium pipe 25A. Hydrogen gas in the forming gas is activated as it comes into contact with the palladium pipe 25A. The forming gas is supplied toward a wafer W in the prober chamber. The activated hydrogen gas reduces or plasma-etches the oxide films of electrodes P on the heated wafer W. The reducing process mechanism 25 can be preferably used when reducing or plasma-etching a metal material made of, e.g., copper or a copper alloy.

FIG. 3A shows a reducing process mechanism 15 used in a prober according to still another embodiment of the present invention. The prober according to this embodiment can be formed in the same manner as in the above embodiments except for the reducing process mechanism 15. A reducing process mechanism 15 which is used in this embodiment and performs at least one of a reducing process and plasma-etching process is formed in a loader chamber 56, as shown in FIG. 3A. Before testing objects W' to be tested formed on a wafer W, the reducing process mechanism 15 reduces the oxide films of electrodes P of the objects W' to be tested formed on the wafer W in the loader chamber 56. The reducing process mechanism 15 can include a processing vessel 35A, a temperature adjusting mechanism 35J which heats and cools the wafer W in the processing vessel 35A, a stage 13, a plurality of elevating pins 35C to receive the wafer W on the stage 13, a gas supply container 15A which is arranged above the processing vessel 35A and has a heater 15B, a gas supply pipe 15C connected to the gas supply container 15A, a gas supply source 15D, and a gas exhaust pipe 15E connected to the gas supply container 15A. A forming gas introduced from the gas supply source 15D through the gas supply pipe 15C is heated in the gas supply container 15A. The heated forming gas is introduced into the processing vessel 35A to reduce the oxide films of the electrodes P of the objects W' to be tested. A wafer transporting mechanism 16A is arranged in the loader chamber 56. The wafer transporting mechanism 16A transports the wafer W between a cassette C and the processing vessel 35A. Preferably, dry air is supplied into the loader chamber 16, in the same manner as in the prober chamber, to adjust interior of the loader chamber 56 to a dry atmosphere. Reference symbol G denotes an opening/closing door to open/close the processing vessel 35A.

The operation of the reducing process mechanism 15 will be described. In the loader chamber 56, the wafer transporting mechanism 16A extracts a wafer W from the cassette C, transports the wafer W into the processing vessel 35A through the opening/closing door G which is open, and places the wafer W from the stage 13 onto the elevating pins 35C that have moved upward. The elevating pins 35C move downward to place the wafer W on the stage 13. The heater 15B of the stage 13 heats the wafer W to a predetermined temperature. Meanwhile, the forming gas is supplied from the gas supply source 15D into the gas supply container 15A. The forming gas is heated in the gas supply container 15A by the temperature adjusting mechanism 35J (e.g., to substantially the same temperature as that of the wafer W). The heated forming gas flows into the processing vessel 35A to reduce or plasma-etch the electrodes P of the objects W' to be tested on the wafer W. After the oxide films are reduced or plasma-etched, the wafer transporting mechanism 16A extracts the wafer W from the processing vessel 35A and transports it into the prober chamber 11. The electrical characteristics of the objects W' to be tested formed on the transported wafer W are tested in the prober chamber 11.

FIG. 3B is different from the apparatus shown in FIG. 3A in that it does not include a heater 15B. A reducing process mechanism 15 shown in FIG. 3B supplies a reducing gas (e.g., a forming gas) from a gas supply source 15D to a processing vessel 35A. The reducing gas partly or entirely reduces the oxide films of electrodes P of heated objects W' to be tested which are on a stage 13 arranged in the processing vessel 35A.

Figure 4:
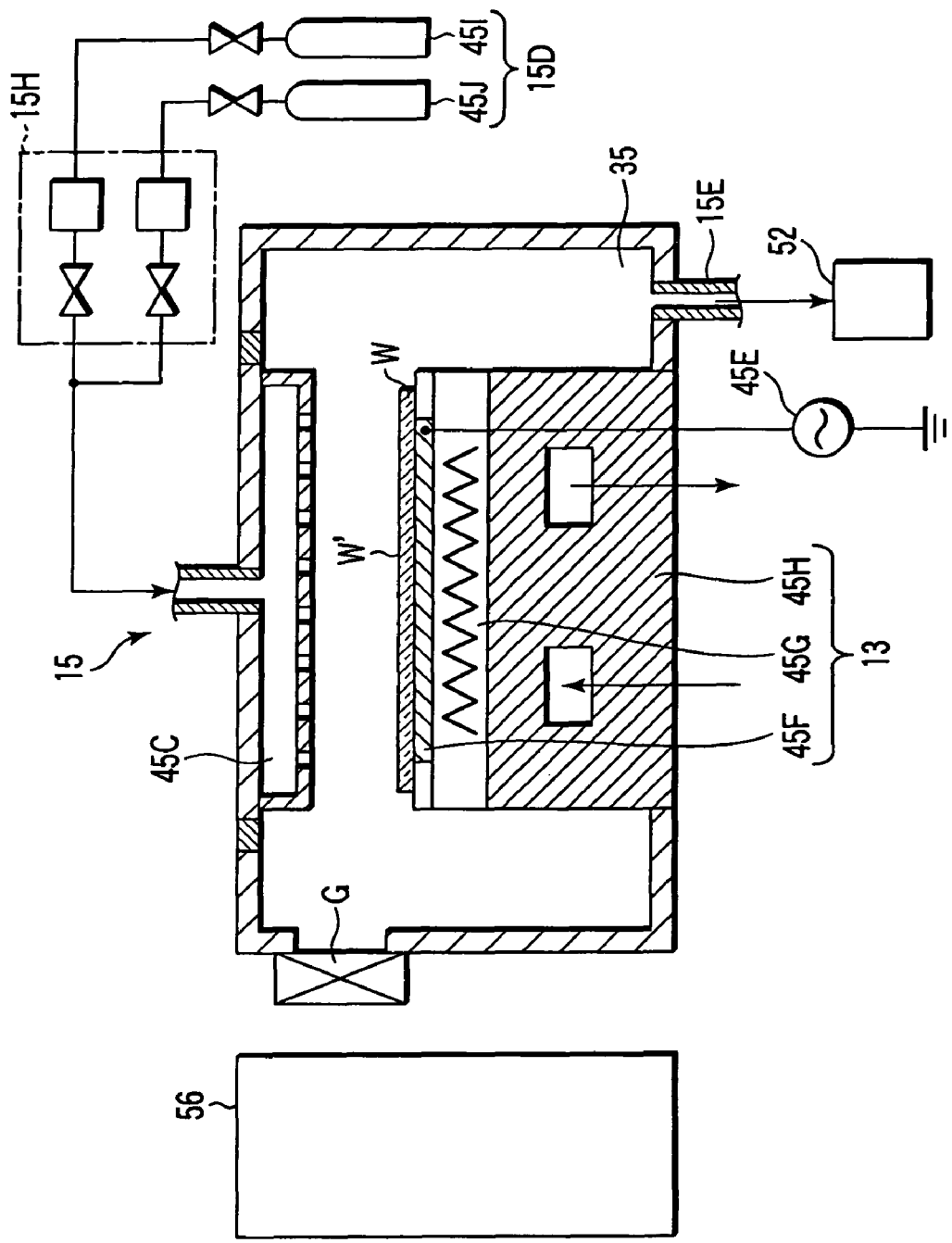
FIG. 4 is a sectional view showing a reducing/plasma-etching process device applied to a prober according to still another embodiment of the present invention.

FIG. 4 shows a reducing process mechanism 15 used in a prober according to still another embodiment of the present invention. The prober according to this embodiment can be formed in the same manner as in the above embodiments except for the reducing process mechanism 15. As shown in FIG. 4, the reducing process mechanism 15 used in this embodiment can include a loader chamber 56, a processing vessel 35 connected to the loader chamber 56 through a door G such that the processing vessel 35 can communicate with and be isolated from the loader chamber 56, a stage 13 arranged in the processing vessel 35 and serving as a lower electrode as well, an upper electrode 45C arranged above the stage 13 to be parallel to it and having a large number of gas supply holes, a gas supply source 15D for supplying a forming gas into the processing vessel 35, and an exhaust device 52 for exhausting the gas in the processing vessel 35. A dry atmosphere can be set in the loader chamber 56.

As shown in, e.g., FIG. 4, the stage 13 can include a lower electrode 45F connected to an 11.56-MHz high-frequency power supply 45E, a heating portion 45G having a heater, a cooling portion 45H arranged under the heating portion 45G and having a refrigerant channel, and elevating pins (35C in FIG. 3A) for vertically moving a wafer W on the stage surface. When the high-frequency power supply 45E applies high-frequency power to the lower electrode 45F under a predetermined reduced pressure, a forming gas plasma is generated between the lower electrode 45F and upper electrode 45C. The heating portion 45G and cooling portion 45H adjust the temperature of the wafer W on the stage 13. As shown in, e.g., FIG. 4, the gas supply source 15D can include a hydrogen gas supply source 45I for supplying hydrogen gas, a nitrogen gas supply source 45J for supplying nitrogen gas, and a mass flow controller 15E for adjusting the flow rates of the hydrogen gas and nitrogen gas. The mass flow controller 15E adjusts the hydrogen gas to a predetermined concentration and supplies it into the processing vessel 35. The processed gas from the processing vessel 35 is exhausted through the gas exhaust pipe 15E.

The operation of the reducing process mechanism 15 will be described. In the loader chamber 56, a wafer W is extracted from a cassette. Before testing the electrical characteristics of objects W' to be tested formed on the wafer W, a wafer transporting mechanism transports the wafer W from the loader chamber-56 onto the stage 13 in the processing vessel 35. The gate valve G is closed to isolate the interior of the processing vessel 35 from external air. Then, an exhaust device 52 exhausts air in the processing vessel 35. Air in the processing vessel 35 is purged with nitrogen gas. A forming gas consisting of hydrogen gas and nitrogen gas is supplied from the gas supply source 15D into the processing vessel 35 at a predetermined flow rate to purge air. The interior of the processing vessel 35 is maintained at a pressure that enables plasmatization. High-frequency power is applied to the lower electrode 45F, and a forming gas is generated between the lower electrode 45F and upper electrode 45C. The plasma etches the oxide films of copper electrodes P of the objects W' to be tested on the wafer W. After the cooling portion 45H quickly cools the wafer W to decrease its temperature to normal temperature, and supply and exhaust of the forming gas are stopped. The gate valve G is opened, and simultaneously the wafer transporting mechanism enters the processing vessel 35. The wafer transporting mechanism unloads the wafer W from the processing vessel 35 into the loader chamber 56. The gate valve G is closed. The wafer W is transported to the prober chamber through the loader chamber 56 which is adjusted to a dry atmosphere. After that, the electrical characteristics of the objects W' to be tested on the wafer W are tested in the prober chamber in the same manner as in the embodiments described above.

EXAMPLES

In the examples, the influences that the oxidation and reducing properties of copper and humidity pose on oxidation were observed specifically through experiments. Also, the probe method of the present invention was specifically practiced to check the effect of reduction.

Example 1

In this example, the reducing performance of the forming gas was observed. The oxide film of a copper wafer (thin copper film=1 μm, TiN underlying layer=15 nm) (to be merely referred to as "reference wafer" hereinafter) for reference was reduced in a forming gas atmosphere. The oxygen concentration distribution in the thin copper film was observed. More specifically, the reference wafer was placed on a stage. The reference wafer was heated on the stage which was set at a temperature of 150° C. In this state, a forming gas (hydrogen gas concentration=3% by volume) was supplied to expose the reference wafer to the forming gas atmosphere. After that, the oxygen concentration distribution in the thin copper film was observed with an X-ray photoelectron spectroscope (XPS). In the same manner, while heating a reference wafer, only nitrogen gas was supplied to expose the reference wafer to a nitrogen gas atmosphere. After that, the oxygen concentration distribution in the thin copper film was observed with the XPS. FIG. 5 shows the results of this observation. According to the results shown in FIG. 5, when the forming gas was supplied, the oxygen concentration became zero at % before the depth from the surface of the thin copper film reached 10 nm. This indicates that the oxide film is greatly thinner than in the reference wafer and is accordingly reliably reduced by the forming gas. In contrast to this, in a non-oxidizing atmosphere obtained by supplying the nitrogen gas, the oxygen concentration was higher than in the reference wafer.

Example 2

According to this example, the influence of the temperature of the stage when reducing the oxide film of a reference wafer by using a forming gas was observed. More specifically, as shown in FIG. 6, the temperature of the stage was changed between 250° C., 300° C., 325° C., and 350° C., and the oxygen concentration distribution in the thin copper film at each temperature was observed with the XPS. FIG. 6 shows the results of this observation. According to the results shown in FIG. 6, the higher the temperature of the stage, the more the reduction was promoted.

Example 3

Figure 7A:
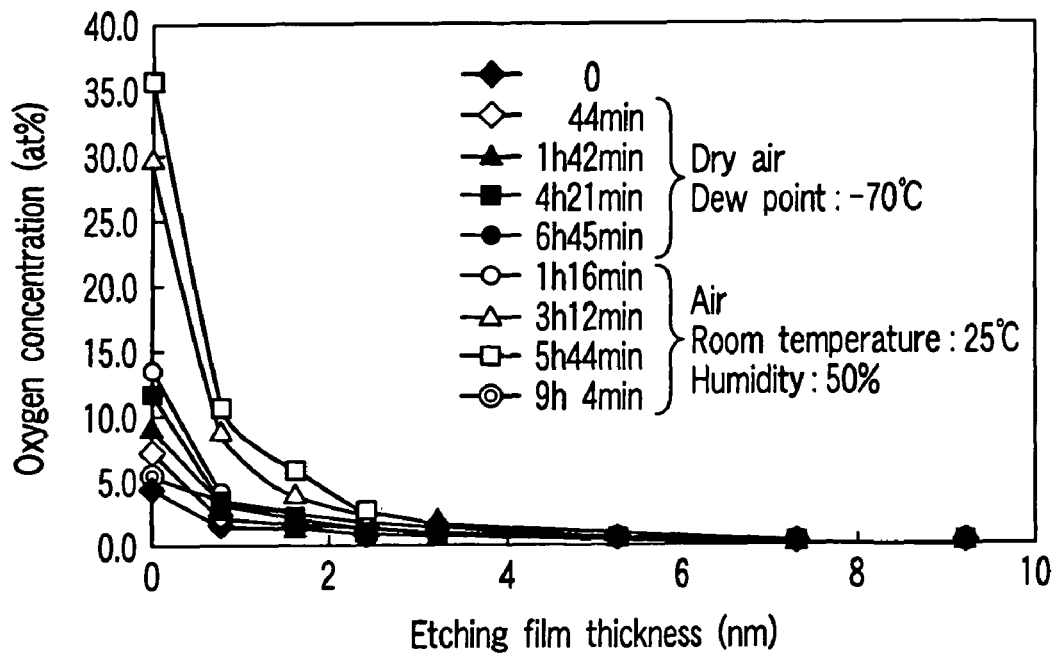
Figure 7B:
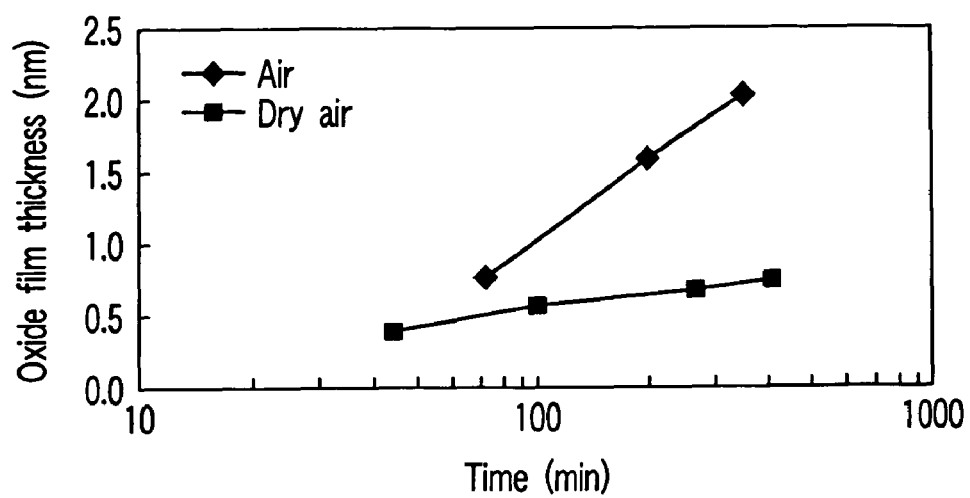

In this example, the influence of humidity on oxidation was observed. More specifically, wafers were left in dry air (dew point: −70° C.), an atmosphere (temperature=25° C., humidity=50%), and nitrogen gas for time periods shown in FIG. 7A. The progress of oxidation of the copper wafers (thin copper film=1 μm, TiN underlying layer=15 nm) in the respective atmospheres were observed. FIG. 7A shows the results of this observation. Oxidation rates in dry air and in atmosphere were obtained. FIG. 7B shows the obtained results. Marks ♦ in FIG. 7A indicate the oxygen concentration distribution in the thin copper film immediately after the copper wafer was fabricated. According to the results shown in FIGS. 7A and 7B, the longer the leaving time in a high-humidity atmosphere, the more the oxidation of the thin copper film progressed, and the larger the thickness of the oxide film to be reduced. In contrast to this, in the dry air, even when the leaving time was long, oxidation did not progress so much as compared to the copper wafer immediately after fabrication. Therefore, even after reduction, if testing was not performed in a humid atmosphere but was performed in dry air, testing could be performed with a lower needle pressure.

Example 4

Figure 8A:
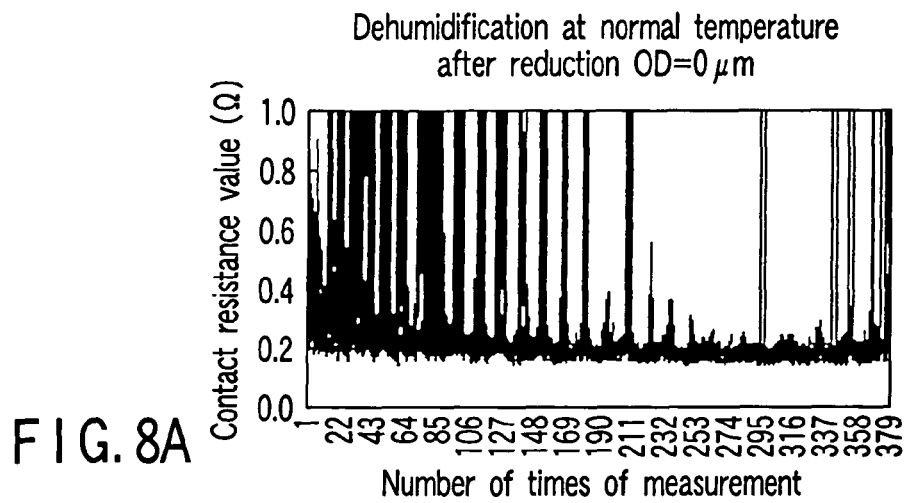
FIGS. 8A to 8C show a probe method according to one embodiment of the present invention, and are graphs showing the relationship between the overdrive amount and contact resistance.
Figure 8B:
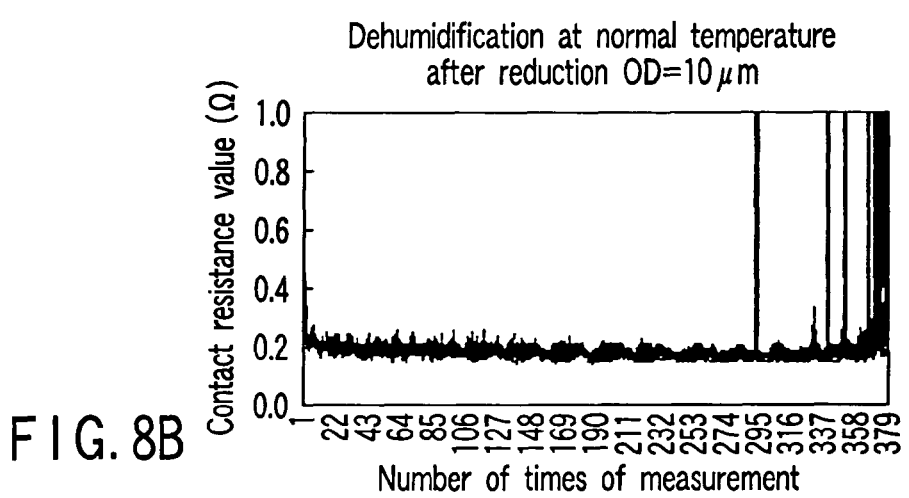
Figure 8C:
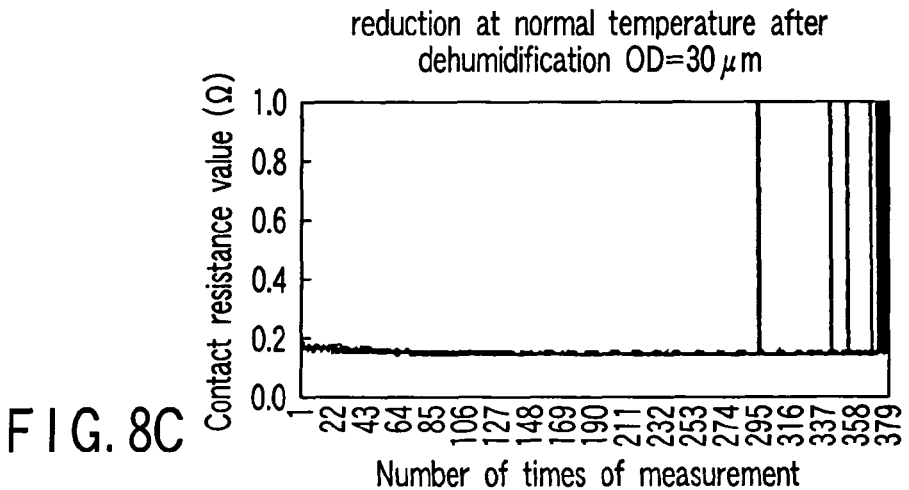
Figure 9A:
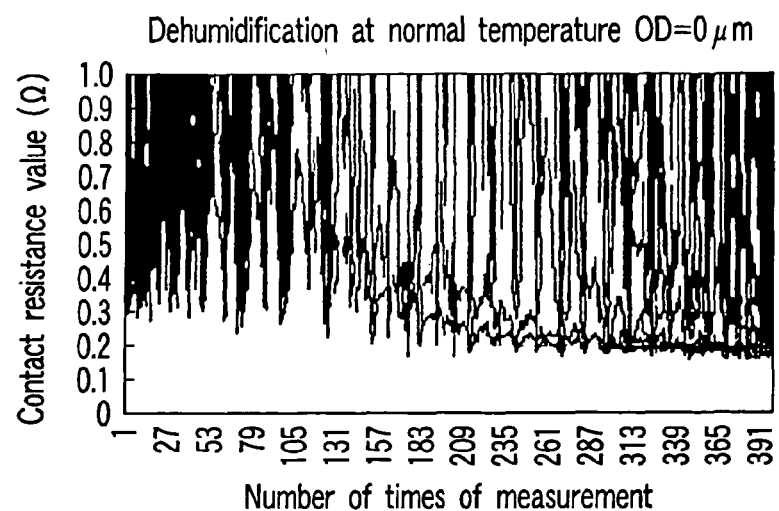
FIGS. 9A to 9C show the relationship between the overdrive amount and contact resistance of a non-reduced copper wafer, and are graphs corresponding to FIGS. 8A to 8C.
Figure 9B:
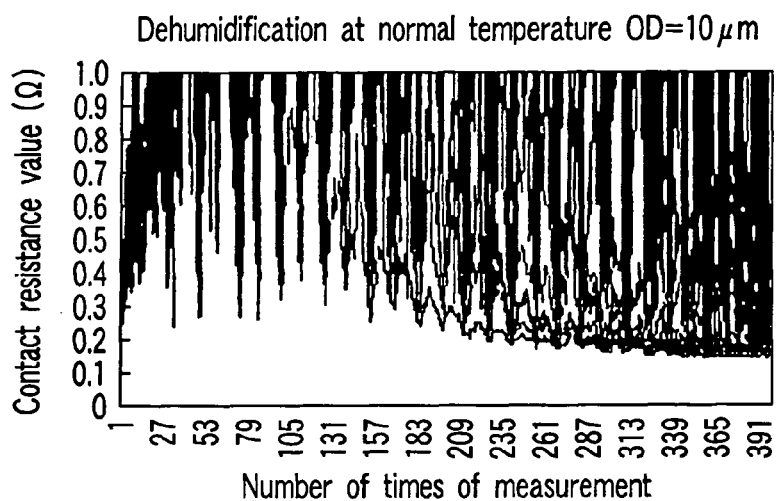
Figure 9C:
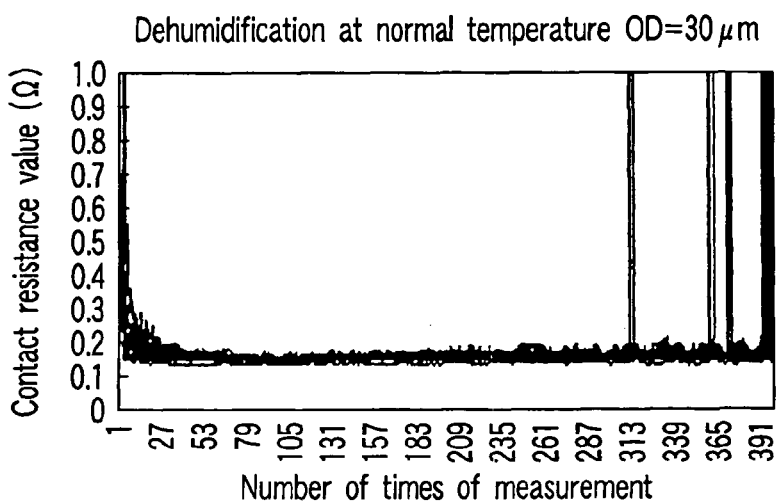

In this example, the relationship between the needle pressure of the probe pins and the contact resistance of the oxide film of the copper wafer in a dry atmosphere was observed. The copper wafer was reduced by using hydrogen gas with the following conditions, and was kept in a nitrogen gas atmosphere for 20 minutes. Then, the reduced copper wafer was placed on the stage. The stage was overdriven in dry air (dew point=−70° C.) to three levels, i.e., 0 μm, 10 μm, and 30 μm. At each overdriven point, the contact resistance between the copper wafer and probe pins was measured. FIGS. 8A to 8C show the relationship between the overdrive amount (needle pressure) and contact resistance. For the sake of comparison, by using a non-reduced copper wafer, the needle pressure of the probe pins and the contact resistance were measured in dry air (dew point: −70° C.) in the same manner. The results of the measurement are shown in FIGS. 9A to 9C. When the overdrive (OD) amount satisfied OD=0 μm, OD=10 μm, and OD=30 μm, the needle pressure was 0 mN, 15 mN, and 50 mN, respectively. When all of the 15 probe pins of the probe card came into contact with the center of the copper wafer and the resistance value was 5 Ω or less, it was determined that OD=0 μm. Also, variations in the Z direction were 10 μm or less.

[Conditions for Reducing Process]
  Pressure in process chamber: 133.332 Pa
  Temperature of stage: 400° C.
  Temperature increase time of stage: 5 minutes
  Reducing process time with hydrogen gas: 15 minutes
  Flow rate of hydrogen gas: 500 sccm
  Cooling time for wafer: 15 minutes According to the results shown in FIGS. 8A to 8C, when the overdrive amount is 0 μm (that is, when the copper wafer and probe pins are merely in contact with each other), sometimes the contact resistance value exceeds 1.0 Ω, as shown in FIG. 8A. As the number of times of measurement increased, however, the contact resistance decreased. When the overdrive amount became 10 μm, the contact resistance value became as low as 0.2 Ω or less from the beginning of measurement, and electrical connection between the thin copper film and probe pins was greatly improved. When the overdrive amount further increased to reach 30 μm, the contact resistance value did not substantially change from that obtained at 10 μm. Hence, wafer testing could be performed reliably with an overdrive amount of 10 μm, that is, with a low needle pressure of 15 mN.

In contrast to this, with a non-reduced copper wafer, as is apparent from the results shown in FIGS. 9A to 9C, even when the copper wafer was placed in a dry air atmosphere, the wafer could not be tested except with an overdrive amount of 30 μm, that is, with a high needle pressure of 50 mN.

Example 5

In this example, the influence of humidity on the contact resistance between a reduced copper wafer and the probe pins was observed. Dry air (dew point=−70° C.) was supplied at a flow rate of 300 L/min. In a dry atmosphere, the copper wafer was overdriven for 10 μm to bring it into contact with the probe pins. The contact resistance of the entire surface of the copper wafer was measured. The result of this measurement was shown in FIG. 10A. Also, in an atmosphere (temperature=25° C., humidity=50.1%), a reduced copper water was overdriven for 10 μm to bring it into contact with the probe pins. The contact resistance of the entire surface of the copper wafer was measured. The result of this measurement is shown in FIG. 10B.

Figure 10A:
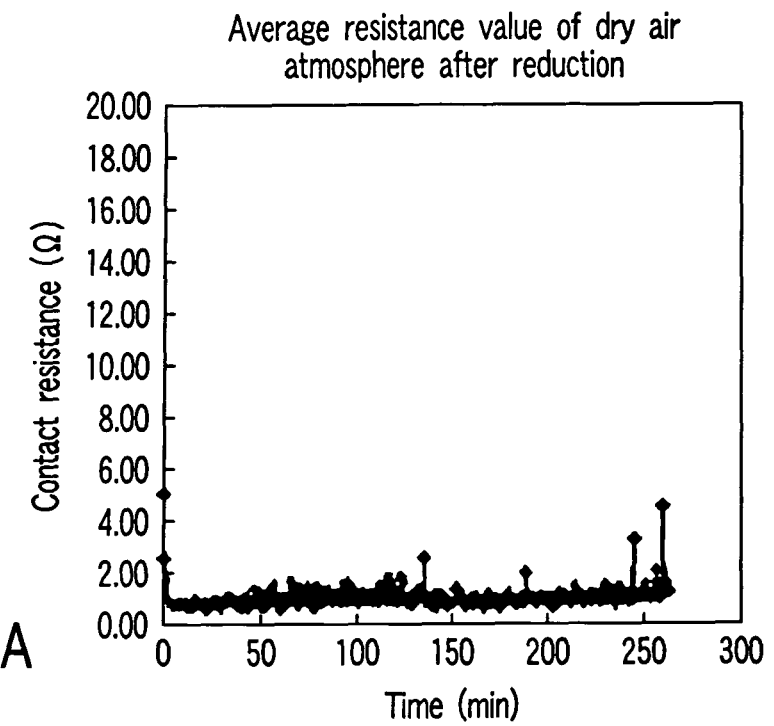
FIG. 10A is a graph showing change over time of the contact resistance of the copper wafer which is measured with the probe method according to one embodiment of the present invention.
Figure 10B:
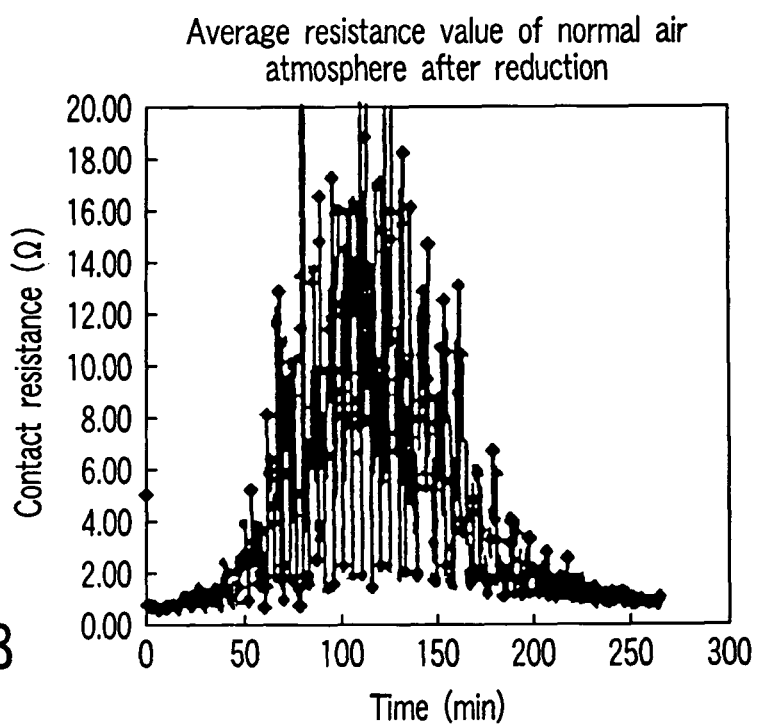
FIG. 10B is a graph showing change over time of the contact resistance of the copper wafer which is obtained by measuring the reduced copper wafer in an atmosphere.

According to the results shown in FIGS. 10A and 10B, in the dry atmosphere, the resistance value was stably 1 Ω or less in the entire surface of the copper wafer. In the atmosphere, the closer to the middle of the measurement time, the much higher the contact resistance value. In this example, as the probe card, a 14-pin probe card which generated a load of 0.2 mN when it was overdriven for 10 μm was used.

From the above description, after the reducing process was performed, in dry air, even if the wafer was left for as long as 4 hours or more, testing could be reliably performed with a low needle pressure of about 0.2 mN. Of the copper wafer on the stage, the central portion is lower than the peripheral portion. Thus, in testing in the atmosphere, even if the overdrive amount stays the same, the needle pressure is lower at the central portion of the wafer than at the peripheral portion. Thus, the contact resistance value increases.

Figure 11:
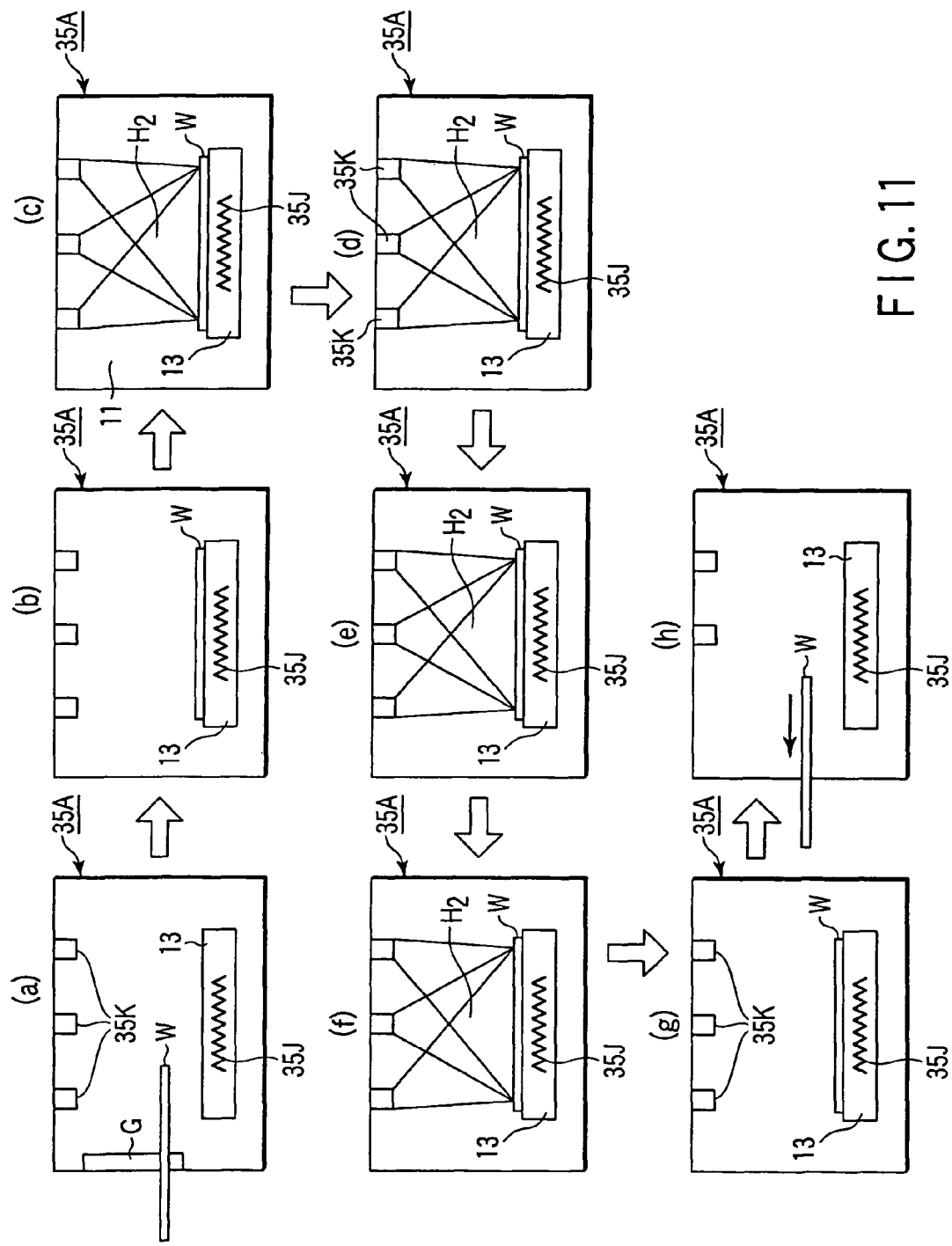
FIGS. 11(a) to 11(h) are conceptual views showing the respective steps in a target object reducing method according to one embodiment of the present invention.

Another embodiment of the probe method of the present invention which uses the reducing process mechanism 15 shown in FIG. 3B will be described with reference to FIGS. 2B, 11, and 12. FIG. 11 shows only the processing vessel 35A of FIG. 3B from the viewpoint of showing the process in the processing vessel 35A shown in FIG. 3B. As shown in FIG. 11(*a*), a transporting mechanism transports a wafer W from the loader chamber 56 onto the elevating pins 35C of the stage 13 in the processing vessel 35A through the opening/closing door G. The elevating pins of the stage 13 move downward to place the wafer W on the stage 13. The stage can fix the wafer W with a vacuum chucking mechanism. The opening/closing door G is closed (see FIG. 11(*b*)). Subsequently, an inert gas (e.g., nitrogen gas at a flow rate of 1 to 2 L/min) is supplied into the processing vessel 35A. Air in the processing vessel 35A is substituted by the nitrogen gas, and an inert gas atmosphere is formed in the processing vessel 35A.

As shown in FIG. 11(*c*), in the inert gas atmosphere, a reducing gas (e.g., a forming gas with normal temperature at a flow rate of 1 to 2 L/min) is supplied from the gas supply pipe 15C toward the wafer W on the stage 13 in the processing vessel 35A.

Figure 2B:
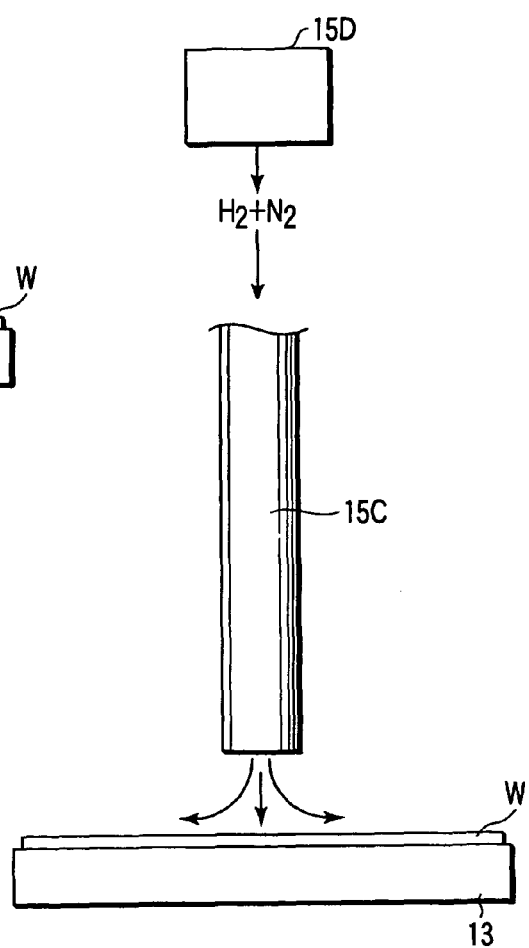

As the gas supply pipe 15C, a pipe 15C (with a diameter of, e.g., 3 to 100 mm) made of a platinum group metal (e.g., palladium) or a pipe 15C containing a palladium foil can be used, as shown in, e.g., FIG. 2B.

As shown in FIG. 11(*d*), the temperature adjusting mechanism 35J heats the stage 13, to quickly heat the wafer W on the stage 13 to, e.g., 150 to 270° C. within a short time (e.g., 5 minutes). At this temperature, as shown in FIG. 11(*e*), the forming gas reduces the electrodes P on the wafer W which are made of copper, a copper alloy, or the like for a short time (e.g., 5 to 20 minutes). After the reducing process, as shown in FIG. 11(f), while the forming gas is supplied successively, the temperature adjusting mechanism 35J quickly cools the wafer W to a normal temperature within a short time (e.g., 5 minutes). As shown in FIG. 11(g), after supply of the forming gas is stopped, nitrogen gas is supplied from the gas supply pipe 15C into the processing vessel 35A. Air in the processing vessel 35A is purged with the nitrogen gas, and an inert gas atmosphere is formed in the processing vessel 35A. The opening/closing door G is opened, and the transporting mechanism transports the reduced wafer W from the processing vessel 35A into the prober chamber 11 (FIG. 1A) through the loader chamber 56. In the prober chamber, the electrical characteristics of the objects W' to be tested formed on the wafer W are tested.

Even when the temperature adjusting mechanism 35J has no cooling means, the stage 13 may be heated, the opening/closing door G may be closed, air in the processing vessel 35A may be purged with the forming gas, and after that the wafer W may be fixed to the stage 13 by chucking and reduced by heating.

Independently of the temperature adjusting mechanism 35J, for example, a cooling device 35M' shown in FIGS. 12A and 12B may be provided. As shown in FIGS. 12A and 12B, the cooling device 35M' has a pair of cooling plates 22C that can be moved for enlargement or reduction. A case wherein this cooling device is used will be described. As described above, the wafer W is heated on the stage 13 in the processing vessel 35A, and is reduced. While supplying the forming gas into the processing vessel 35A, the elevating pins 35C lift the wafer W from the stage 13. In this state, the cooling plates 22C enter between the wafer W and stage 13 to sandwich the elevating pins 35C. The elevating pins 35C place the wafer W on the cooling plates 22C, or place it to be slightly separate from the cooling plates 22C. The wafer W is cooled by the cooling plates 22C. After cooling, the pair of cooling plates 22C retreat from the stage 13. The transporting mechanism 16A transports the wafer W supported by the elevating pins 35C to the prober chamber 11. Alternatively, the cooling plates 22C may not be used, and while the forming gas is supplied into the processing vessel 35A and the elevating pins 35C lift the wafer W from the stage 13, the wafer W may be cooled. Also, the forming gas may be supplied after the wafer W is lifted.

A case wherein reduction of the oxide film of the copper wafer (thin copper film=1 μm, TiN underlying layer=15 nm) is performed with a normal-temperature forming gas and a case wherein the copper wafer is heated and reduction is performed with a forming gas will be described with reference to FIGS. 13 to 15. Steps before and after the reducing process are performed in the same manner as in the embodiments described above.

Example 6

In Example 6, the reducing performance of room-temperature hydrogen gas and that of heated (activated) hydrogen gas were observed. After a nitrogen atmosphere is set in the processing vessel 35A, an oxide film on a copper wafer is reduced in a forming gas atmosphere. The concentration distribution of oxygen atoms (to be merely referred to as "oxygen concentration distribution" hereinafter) in a reduced thin copper film layer was observed. More specifically, the copper wafer is placed on the stage 13 which is set at a temperature of 350° C., and is heated to 270° C. In the heated state, a room-temperature forming gas (hydrogen gas concentration=3% by volume, a flow rate=1 L/min to 2 L/min) is supplied toward the copper wafer to reduce it for 20 minutes. After that, the oxygen concentration distribution in the thin copper film layer was observed with the X-ray photoelectron spectroscope (XPS). The result of the observation was shown in FIG. 13 by plotting marks ■. In the same manner, a forming gas (hydrogen gas is activated) heated to 550° C. is supplied to a copper wafer heated to 335° C. toward the copper wafer to reduce it for 20 minutes. After that, the oxygen concentration distribution in the thin copper film layer was observed with the XPS. The results of the observation are shown in FIG. 13 by plotting marks ▲. The oxygen concentration distribution in the copper wafer before the reducing process is shown in FIG. 5 by plotting marks ♦.

Figure 13:
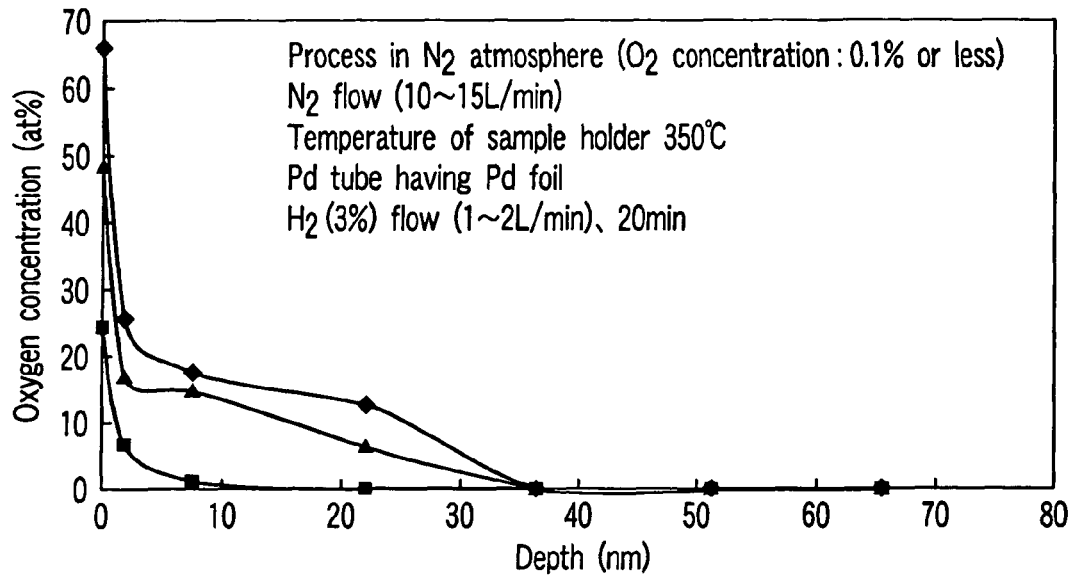
FIG. 13 is a graph showing the relationship between the oxygen concentration and the depth from the surface of a thin copper film layer to exhibit the experimental result of Example 6 of the present invention.

According to the results shown in FIG. 13, when the room-temperature forming gas is supplied, the oxygen concentration becomes zero at % before the depth from the surface of the copper thin film layer reaches 20 nm, as indicated by the marks ■ in FIG. 13. When the heated forming gas is supplied, an oxygen concentration of 7 at % to 8 at % was exhibited at a depth of 20 nm from the surface of the thin copper film layer, as indicated by the marks ▲ in FIG. 13. When the heated forming gas is used, the reducing performance with hydrogen is lower than in a case wherein the room-temperature forming gas is used. Accordingly, the forming gas at room temperature, i.e., room-temperature hydrogen gas, has a higher reducing ability than that of the heated hydrogen gas. This results show that when room-temperature hydrogen is used, hydrogen is adsorbed by the surface of the copper wafer, and is activated by the temperature of the wafer. Activated hydrogen reduces copper oxide. An oxygen concentration gradient forms between the surface and the interior of the thin copper film layer. Consequently, diffusion of oxygen atoms is promoted from the interior toward the surface. Simultaneously, a temperature difference is formed between the surface and the interior of the thin copper film layer the temperature of which has been decreased by the room-temperature hydrogen gas. This temperature gradient diffuses the oxygen atoms in the thin copper film layer toward the surface. It is estimated that the diffused oxygen atoms are reduced by hydrogen. In contrast to this, when heated hydrogen is used, the temperature in the thin copper film layer of the copper wafer is higher than the temperature of the surface of the thin copper film layer. It is estimated that diffusion of oxygen atoms in the thin copper film layer is delayed, so that reducing reaction by hydrogen is delayed. In other words, it is estimated that diffusion of oxygen atoms in the thin copper film layer controls the speed of the reducing reaction.

Example 7

In Example 7, a copper wafer was placed in a nitrogen gas atmosphere, and the oxygen concentration distribution in the oxide film layer of the copper wafer was observed in a case wherein room-temperature hydrogen gas was supplied to the copper wafer and a case wherein such hydrogen gas was not supplied to it. In the same manner as in Example 6, the copper wafer was placed on the stage 13 heated to 350° C. A room-temperature forming gas was supplied to the copper wafer heated to 270° C. at a flow rate of 1 to 2 L/min, to reduce the copper wafer for 20 min. The oxygen concentration distribution in the thin copper film layer was observed with the X-ray photoelectron spectroscope (XPS). As a result, an oxygen concentration distribution indicated by marks ● in FIG. 14 was obtained. After the copper wafer was heated in a nitrogen gas atmosphere at 335° C. for 20 minutes, the oxygen concentration distribution in the thin copper film layer was observed with the XPS. As a result, an oxygen concentration distribution indicated by marks ■ in FIG. 14 was obtained.

Figure 14:
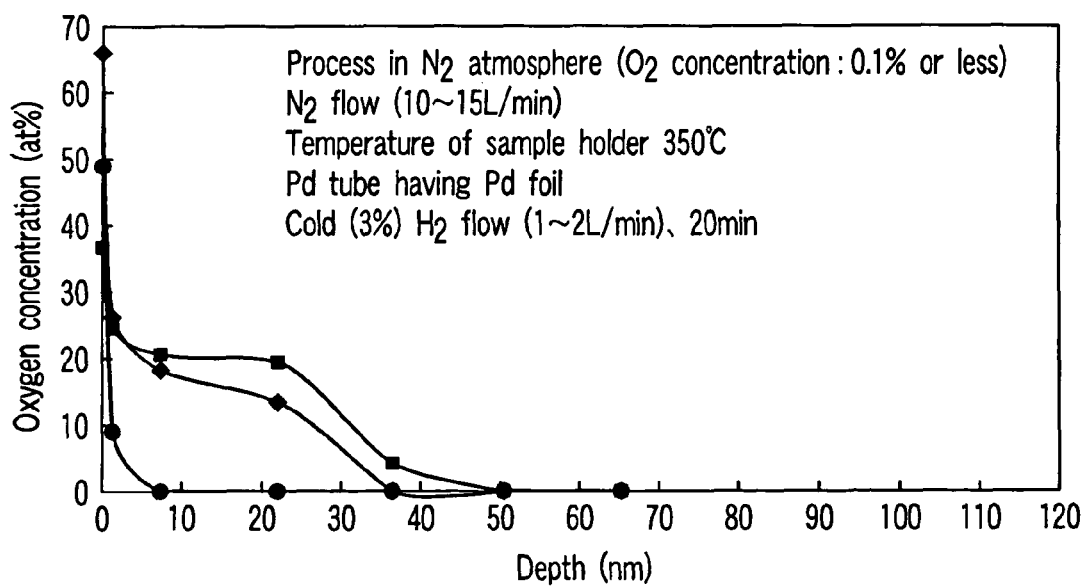
FIG. 14 is a graph showing the relationship between the oxygen concentration and the depth from the surface of a thin copper film layer to exhibit the experimental result of Example 7 of the present invention.

The oxygen concentration distribution of the copper wafer before the reducing process is shown in FIG. 14 by plotting marks ♦.

According to the results shown in FIG. 14, the same results as those of Example 6 are obtained, that is, when the room-temperature forming gas was supplied under the same conditions as those in Example 6, reduction in the thin copper film layer was promoted, as indicated by the marks ● in FIG. 14. In contrast to this, when the copper wafer is heat-treated in a nitrogen gas atmosphere, oxidation reaction by oxygen contained as an impurity in the nitrogen gas progresses, as indicated by the marks ■ in FIG. 14, and the oxygen concentration becomes higher than that in an unprocessed copper wafer indicated by the marks ♦ in FIG. 14.

Example 8

In Example 8, the influence of the temperature of the copper wafer on reducing reaction was observed. In Example 8, reduction and heat treatment were performed while increasing the temperature of the copper wafer to be higher than in the case of Example 7. More specifically, when reducing the copper wafer, the reducing process of a thin copper film layer was performed with the same conditions as in Examples 6 and 7 except that the temperature of the copper wafer was increased to 340° C. As a result, an oxygen concentration distribution indicated by marks ● in FIG. 15 was obtained. Heat treatment of the thin copper film layer was performed with the same conditions as in Example 7 except that the temperature of the copper wafer was increased to 400° C. As a result, an oxygen concentration distribution indicated by marks ■ in FIG. 15 was obtained. The oxygen concentration distribution of the copper wafer before the reducing process is shown in FIG. 15 by plotting marks ●.

Figure 15:
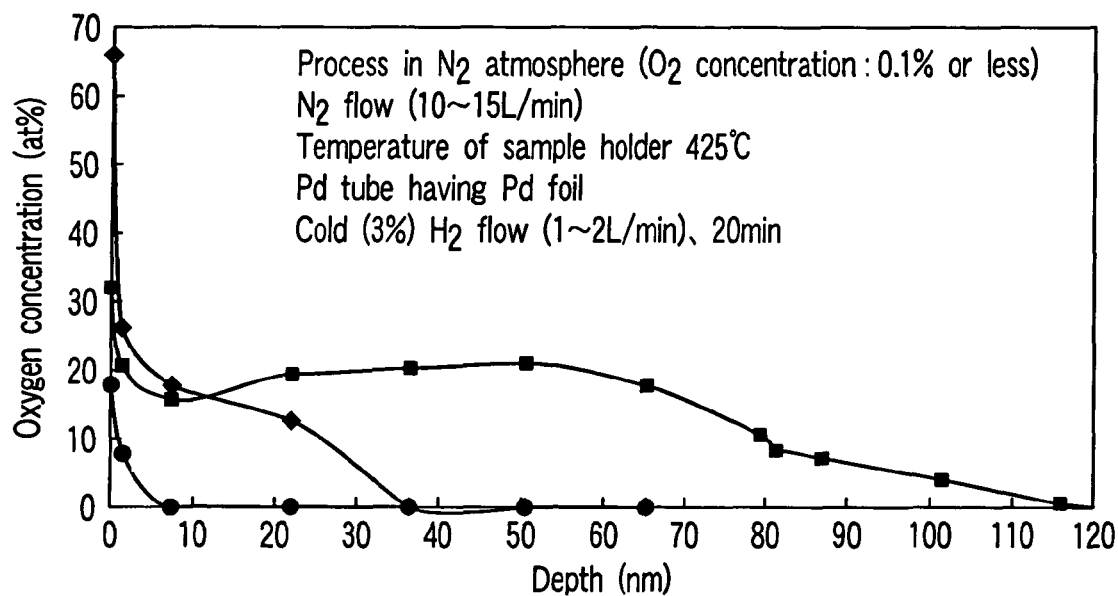
FIG. 15 is a graph showing the relationship between the oxygen concentration and the depth from the surface of a thin copper film layer to exhibit the experimental result of Example 8 of the present invention.

According to the results shown in FIG. 15, when a reducing process was performed with the room-temperature forming gas, the same results as in Examples 6 and 7 were obtained, as indicated by the marks ● in FIG. 15. Accordingly, when reducing a copper wafer with room-temperature hydrogen gas, the temperature of the copper wafer may be increased to 270° C. at most, as indicated by the marks ● in FIG. 15. In contrast to this, when the copper wafer was heat-treated in a nitrogen gas atmosphere, the higher the temperature of the copper wafer, the more the oxidation reaction progressed, and the larger the thickness of a copper oxide, as indicated by the marks ■ in FIG. 15.

In the above examples, the description of a reducing reaction at 270° C. or less was omitted. When the temperature of the copper wafer fell in the range of 150 to 270° C., reduction results similar to those of the above embodiments were obtained. Even when the wafer W was heated to a temperature higher than the upper limit of this temperature range, the reducing ability did not improve.

As has been described, according to this embodiment, when reducing the oxide film of the thin copper film layer formed on the copper wafer under atmospheric pressure, a nitrogen gas atmosphere was formed in advance. The copper wafer was heated to a range of 150 to 270° C., and a room-temperature forming gas was blown to the surface of the heated copper wafer. Therefore, even under atmospheric pressure, the copper oxide on the surface of the thin copper film layer of the copper wafer could be reduced at a comparatively low heating temperature. In addition, damage to the copper wafer could be prevented.

According to this embodiment, prior to testing the electrical characteristics of a wafer by bringing probe pins into contact with the electrodes, made of copper or a copper alloy, of the wafer, the oxide films of the electrodes are reduced under atmospheric pressure. In this reduction, a nitrogen gas atmosphere is formed in advance in a processing vessel 15a of the loader chamber 56, and after that the wafer is heated to the range of 150 to 270° C. The room-temperature forming gas is blown to the surface of the heated wafer, so that the copper oxide on the electrode surfaces of the wafer can be reduced at a comparatively low heating temperature even under atmospheric pressure. In testing the electrical characteristics of the wafer, the probe pins and the electrodes need only be brought into contact with each other with a very low needle pressure (e.g., 0.2 mN or less), so that they are brought into electrical contact with each other. When compared to the prior art, the needle pressure between the probe pins and electrodes can be largely suppressed. Damage to the electrodes or the like can be prevented.

Therefore, even when deposition layers such as electrodes or their underlying layers become thin, the deposition layers will not be damaged by the needle pressure from the probe pins, and stable, highly reliable testing can be performed.

According to the embodiments of the present invention, there can be provided a target object reducing method which can reduce an oxide or the like on the surface of the metal layer or on the surface of an electrode layer of a target object under atmospheric pressure and with a comparatively low heating temperature, so that damage to the target object can be decreased.

The present invention is not limited to the above embodiments at all. For example, the wafer reducing process means can employ various types of embodiments in addition to the arrangements shown in the respective embodiments. The gas containing hydrogen gas is not limited to a forming gas, but when necessary, a carrier gas may be appropriately selected and used. When performing the wafer reducing process, wafers in the cassette can be reduced at once simultaneously. In the above embodiments, as the objects W' to be tested, integrated circuits formed on the wafer W were used. However, the present invention can also be applied to a package article other than a wafer.

According to the embodiments of the present invention, there can be provided a probing method, a prober, and an electrode reducing/plasma-etching mechanism which, even when deposition layers such as testing electrodes become thin, can bring probe pins into electrical contact with the testing electrodes with as low a needle pressure as possible without damaging the deposition layers, and can electrically connect the probe pins and the testing electrodes to each other reliably, so that highly reliable testing can be performed.

What is claimed is:

1. A probe method of bringing a probe pin into electrical contact with at least one electrode to test electrical characteristics of an object to be tested, the probe method comprising:
    (a) performing a reducing process for the electrode of the object to be tested by bringing a gas obtained by activating a hydrogen-containing gas with a catalyst metal into contact with a surface of the electrode of the object to be tested; (a1) stopping supply of the hydrogen-containing gas and exhausting the hydrogen-containing gas after lowering a temperature of the object to be tested to a normal temperature by accelerated cooling; (b) bringing the electrode of the object to be tested and the probe pin into contact with each other in a non-oxidizing atmosphere; and (c) testing the electrical characteristics of the object to be tested.

2. A probe method according to claim 1, wherein the catalyst metal is at least one of a platinum group metal and an alloy of the platinum group metal.

3. A probe method according to claim 1, wherein the reducing process comprises heating the object to be tested.

4. A probe method according to claim 1, which further comprises prior to the reducing process of the electrode of the object to be tested, placing the object to be tested in an inert gas atmosphere and heating the object to be tested, and
in which the reducing process is performed by bringing a reducing gas into contact with the electrode of the object to be tested under atmospheric pressure.

5. A probe method according to claim 4, wherein a temperature to which the object to be tested is heated prior to reducing the electrode of the object to be tested falls within a range of 150 to 270° C.

6. A probe method according to claim 1, wherein the reducing gas in the reducing process is one of a normal-temperature reducing gas containing hydrogen gas and a normal-temperature forming gas.

7. A prober for bringing a probe pin into electrical contact with at least one electrode to test electrical characteristics of an object to be tested, the prober comprising: a reducing process mechanism which performs a reducing process using a reducing gas by bringing a gas obtained by activating a hydrogen-containing gas with a catalyst metal into contact with a surface of the electrode of the object to be tested; a cooling portion; an exhaust device; a controller, wherein the controller controls the cooling portion so as to perform accelerated cooling to lower a temperature of the object to be tested to a normal temperature by accelerated cooling, and, after the object to be tested is lowered to the normal temperature, controls the reducing process mechanism and the exhaust device to stop supply of the hydrogen-containing gas and exhaust the hydrogen-containing gas; and a mechanism which moves at least one of the object to be tested and probe pin in a non-oxiding atmosphere, to bring the electrode of the object to be tested and the probe pin into electrical contact with each other.

8. A prober according to claim 7, further comprising a mechanism which places the object to be tested in an inert gas atmosphere and heats the object to be tested prior to the reducing process of the electrode of the object to be tested,
wherein the reducing process with the reducing process mechanism is performed by bringing the reducing gas into contact with the electrode of the object to be tested under atmospheric pressure.

9. A prober according to claim 7, wherein the reducing gas in the reducing process is one of normal-temperature gas containing hydrogen gas and a normal-temperature forming gas.

10. A prober according to claim 7, wherein a temperature to which the object to be tested is heated prior to reducing the electrode of the object to be tested falls within a range of 150 to 270° C.

11. A prober according to claim 7, further comprising a mechanism which sets a non-oxidizing atmosphere at least around the electrode of the object to be tested which has been processed by the reducing process mechanism.

12. A prober according to claim 11, wherein the mechanism which sets the non-oxidizing atmosphere sets a dry atmosphere at least around the electrode.

13. A prober according to claim 7, wherein
the prober comprises a prober chamber where the electrical characteristics of the object to be tested are tested, and
the reducing process mechanism is arranged in the prober chamber.

14. A prober according to claim 7, wherein the reducing process mechanism has a processing vessel, a stage which is arranged in the processing vessel and on which the object to be tested is to be placed, a temperature adjusting mechanism of the stage, and a mechanism which supplies a reducing gas to a surface of the object to be tested which is heated by the temperature adjusting mechanism.

15. A prober according to claim 14, wherein means for supplying the reducing gas to the surface of the object to be tested includes a supply source of a gas containing hydrogen gas, a gas channel where the gas is supplied from the supply source of the gas, and means for activating the gas in the gas channel.

16. A prober according to claim 15, wherein the means for activating the gas in the gas channel comprises a catalyst metal which is arranged on an inner surface of the gas channel.

17. A prober according to claim 7, wherein the catalyst metal is at least one of a platinum group metal and an alloy of the platinum group metal.

18. A prober according to claim 7, wherein the reducing process mechanism comprises a mechanism for heating the object to be tested.

19. A probe method of bringing a probe pin into electrical contact with at least one electrode to test electrical characteristics of an object to be tested, the probe method comprising:
(a) performing a plasma-etching process for an oxide film on the electrode of the object to be tested by a gas containing plasmatized hydrogen gas, wherein the plasmatizing process is performed by heating the gas; (a1) stopping supply of the gas containing hydrogen gas and exhausting the gas containing hydrogen gas after a cooling portion performs accelerated cooling for the object to be tested to lower a temperature of the object to be tested to a normal temperature; (b) bringing the electrode of the object to be tested and the probe-pin into contact with each other in a non-oxidizing atmosphere; and (c) testing the electrical characteristics of the object to be tested, wherein, prior to the plasma-etching process of the electrode of the object to be tested, the probe method further comprises placing the object to be tested in an inert gas atmosphere and heating the object to be tested.

20. A probe method according to claim 19, wherein the plasma-etching process comprises heating the object to be tested.

21. A prober for bringing a probe pin into electrical contact with at least one electrode to test electrical characteristics of an object to be tested, the prober comprising: (a1) a gas supply source which supplies gas containing hydrogen gas; (a2) a plasma-etching process mechanism which performs an etching process using a plasma gas for an oxide film on the electrode of the object to be tested by the gas supplied from the gas supply source and containing plasmatized hydrogen gas, wherein the plasmatizing process is performed by heating the gas; (a3) a cooling portion; (a4) an exhaust device; and (a5) a controller, wherein the controller controls the cooling portion so as to perform accelerated cooling to lower a temperature of the object to be tested to a normal temperature, and, after the temperature of the object to be tested is lowered to the normal temperature, controls the gas supply source and the exhaust device to stop supply of the gas containing hydrogen gas and exhaust the gas containing hydrogen gas.

22. A prober according to claim 21, wherein the plasma-etching process mechanism comprises a mechanism for heating the object to be tested.

23. A prober according to claim 21, wherein the gas containing hydrogen in the plasma-etching process is one of normal-temperature reducing gas containing hydrogen gas and a normal-temperature forming gas.

24. A prober according to claim 21, further comprising a mechanism which sets a non-oxidizing atmosphere at least around the electrode of the object to be tested which has been processed by the plasma-etching process mechanism.

25. A prober according to claim 24, wherein the mechanism which sets the non-oxidizing atmosphere sets a dry atmosphere at least around the electrode.

26. A prober according to claim 21, wherein the prober comprises a prober chamber where the electrical characteristics of the object to be tested are tested, and the plasma-etching process mechanism is arranged in the prober chamber.

27. A prober according to claim 26, wherein the plasma-etching process mechanism has a processing vessel, a stage which is arranged in the processing vessel and on which the object to be tested is to be placed, a temperature adjusting mechanism of the stage, a mechanism which supplies the gas containing hydrogen to the processing vessel, and a mechanism which plasmatizes the gas containing hydrogen.

* * * * *